United States Patent [19]

Gingrich

[11] 4,083,430
[45] Apr. 11, 1978

[54] APPARATUS FOR DETERMINING THE LOCATION OF AN ELEVATOR CAR OR SIMILAR VEHICLE

[75] Inventor: John A. Gingrich, Toronto, Canada

[73] Assignees: Dover Corporation (Canada) Limited, Toronto, Canada; Dover Corporation, New York, N.Y.

[21] Appl. No.: 728,006

[22] Filed: Sep. 29, 1976

[51] Int. Cl.² .............................................. B66B 3/02
[52] U.S. Cl. ................................................. 187/29 R
[58] Field of Search ......................................... 187/29

[56] References Cited

U.S. PATENT DOCUMENTS

| | | | |
|---|---|---|---|
| 3,407,905 | 10/1968 | Gingrich | 187/29 |
| 3,414,088 | 12/1968 | Bruns et al. | 187/29 |
| 3,483,950 | 12/1969 | Simpson | 187/29 |
| 3,526,300 | 9/1970 | Ferrot | 187/29 |
| 3,589,474 | 6/1971 | Waure | 187/29 |
| 3,750,850 | 8/1973 | Winkler et al. | 187/29 |
| 3,773,146 | 11/1973 | Dixon, Jr. et al. | 187/29 |
| 3,963,098 | 6/1976 | Lewis et al. | 187/29 |
| 3,979,091 | 9/1976 | Gagnon et al. | 246/8 |
| 3,983,961 | 10/1976 | Aron | 187/29 |

FOREIGN PATENT DOCUMENTS 669,267  8/1963  Canada .................................. 187/29

Primary Examiner—Robert K. Schaefer
Assistant Examiner—W. E. Duncanson, Jr.
Attorney, Agent, or Firm—Brumbaugh, Graves, Donohue & Raymond

[57] ABSTRACT

An elevator control system using vertically elongated single-turn loops of wire movable with the car past a vertical column of stationary coils of wire, one at each floor, which are de-energized one at a time repetitively at high speed. The sudden collapse of magnetic flux from a coil induces a pulse into the loops if the car is adjacent. Each loop has one or more twists so that the polarities of the induced pulses vary in a predictable manner over the vertical length of the loops. When pulses are induced in the loops, the unique combination of positive and negative pulses defines the quantized distance between the car floor and the building floor whose coil caused the pulses. The quantized distance between the car floor and any desired target floor in the building is computed repetitively by adding the pertinent floor heights, as stored in a memory, to the reading obtained from the loops.

23 Claims, 29 Drawing Figures

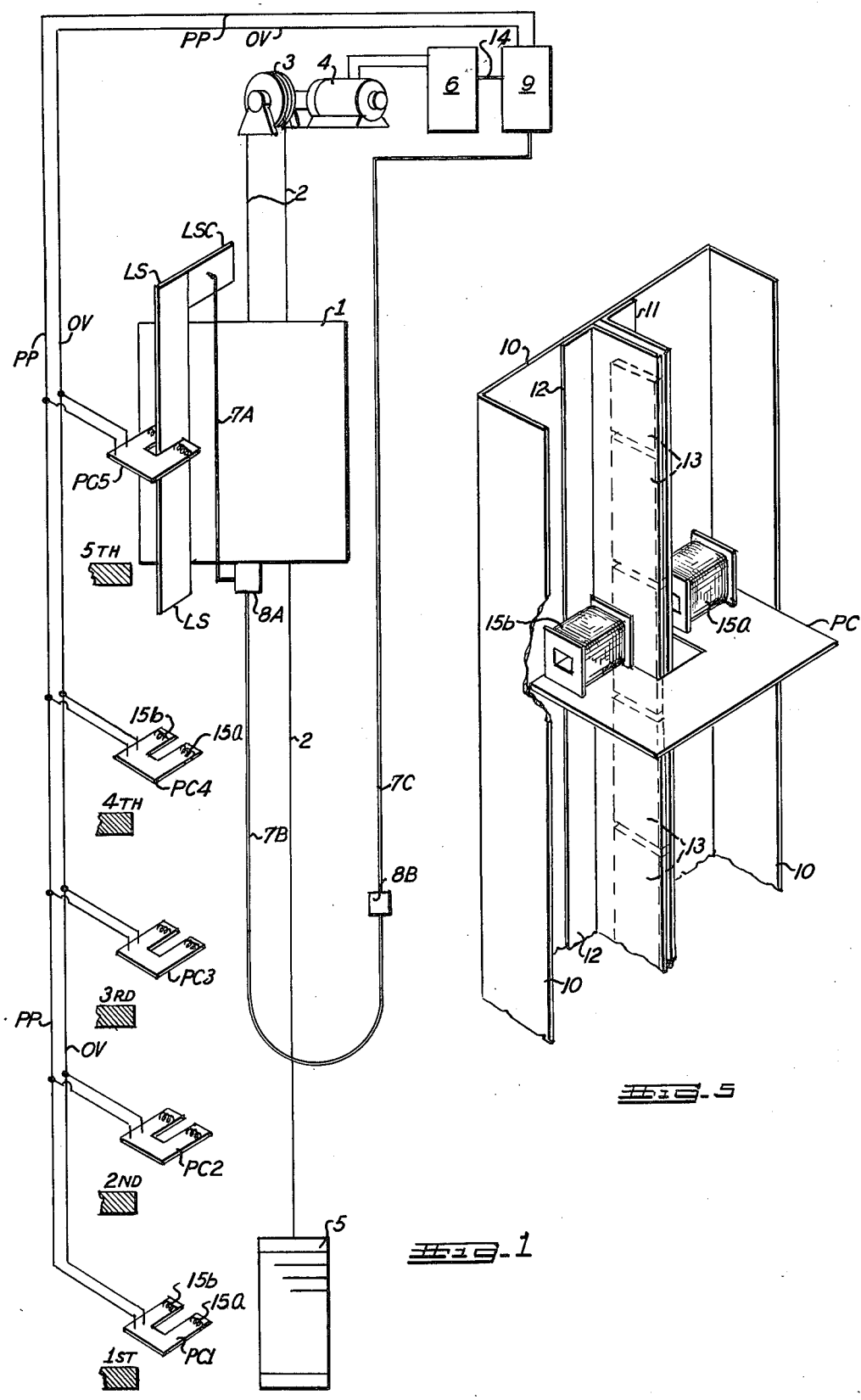

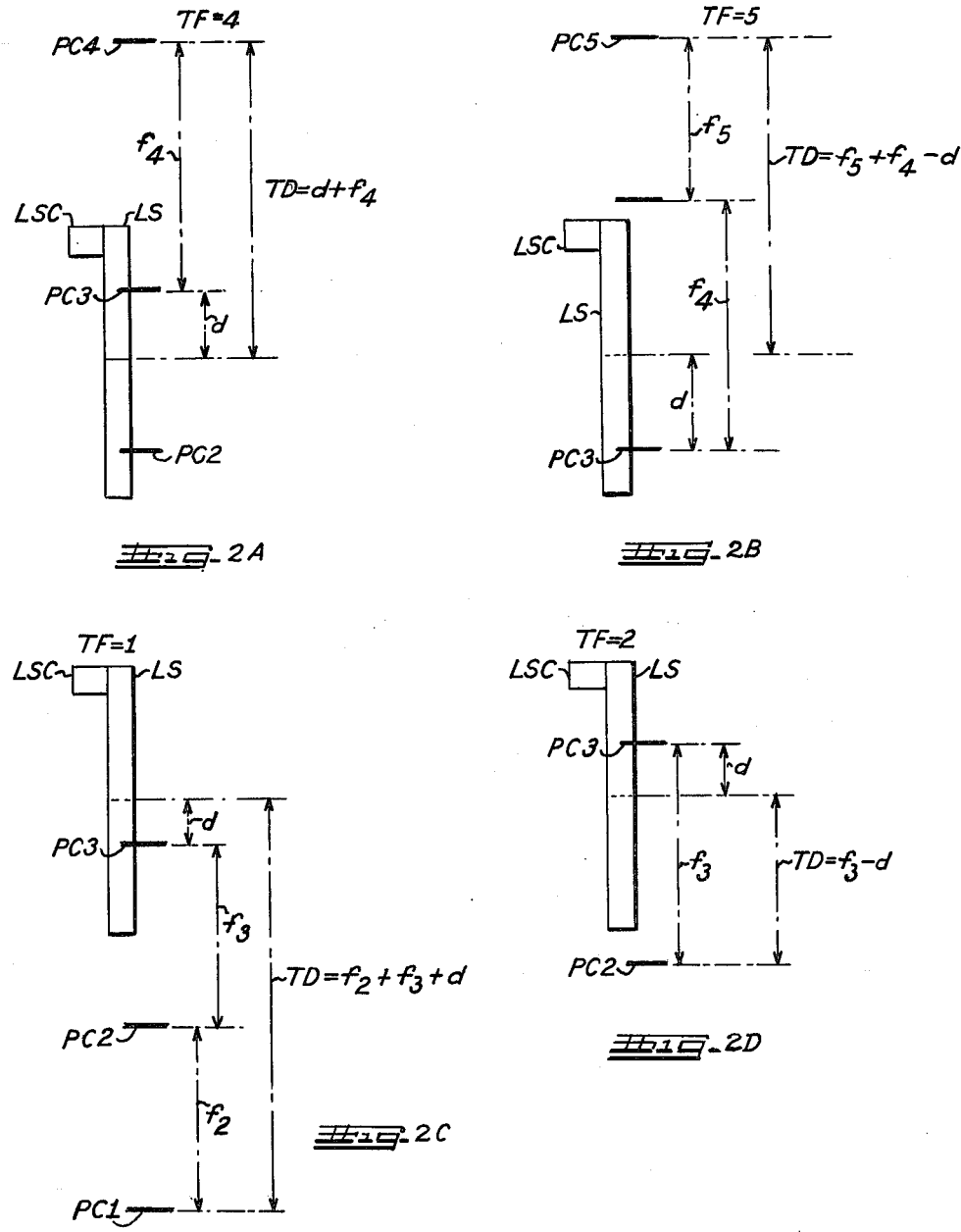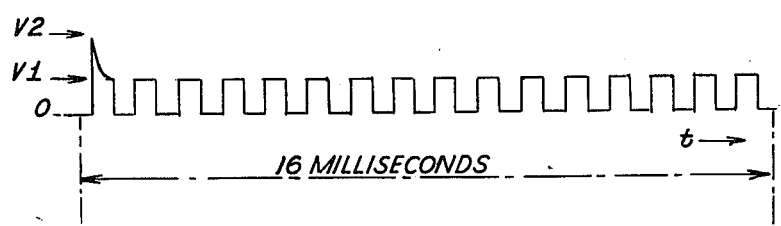

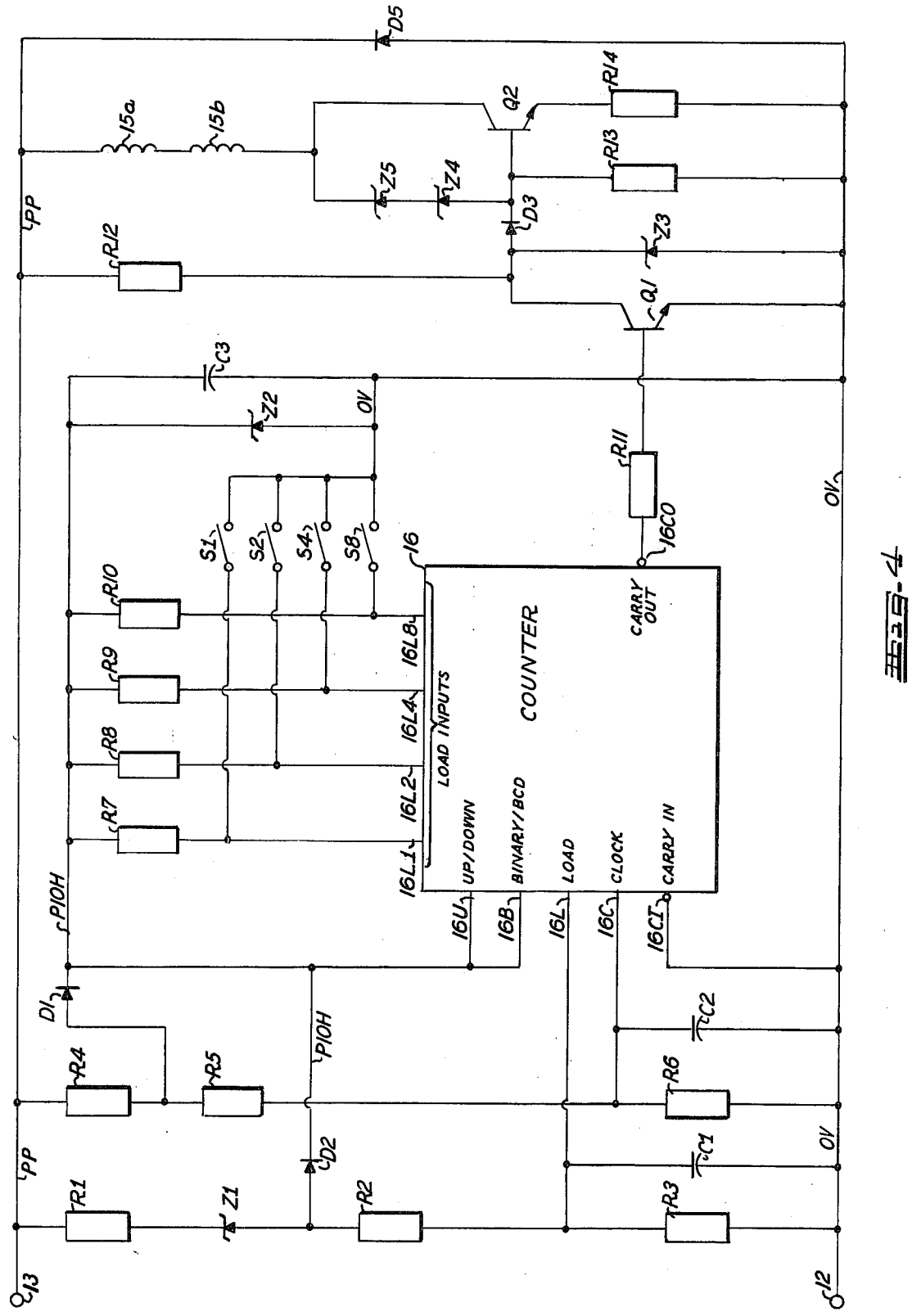

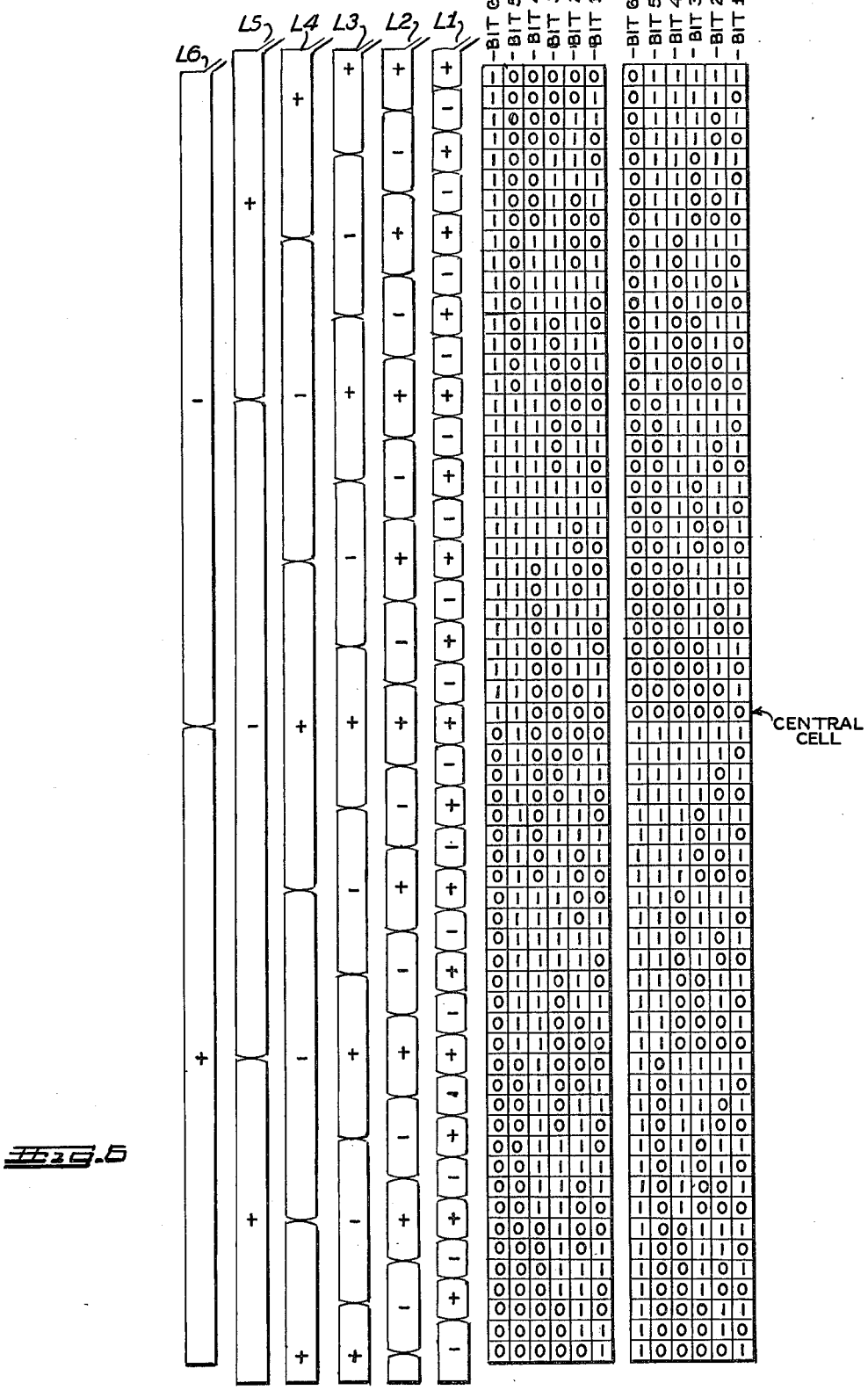

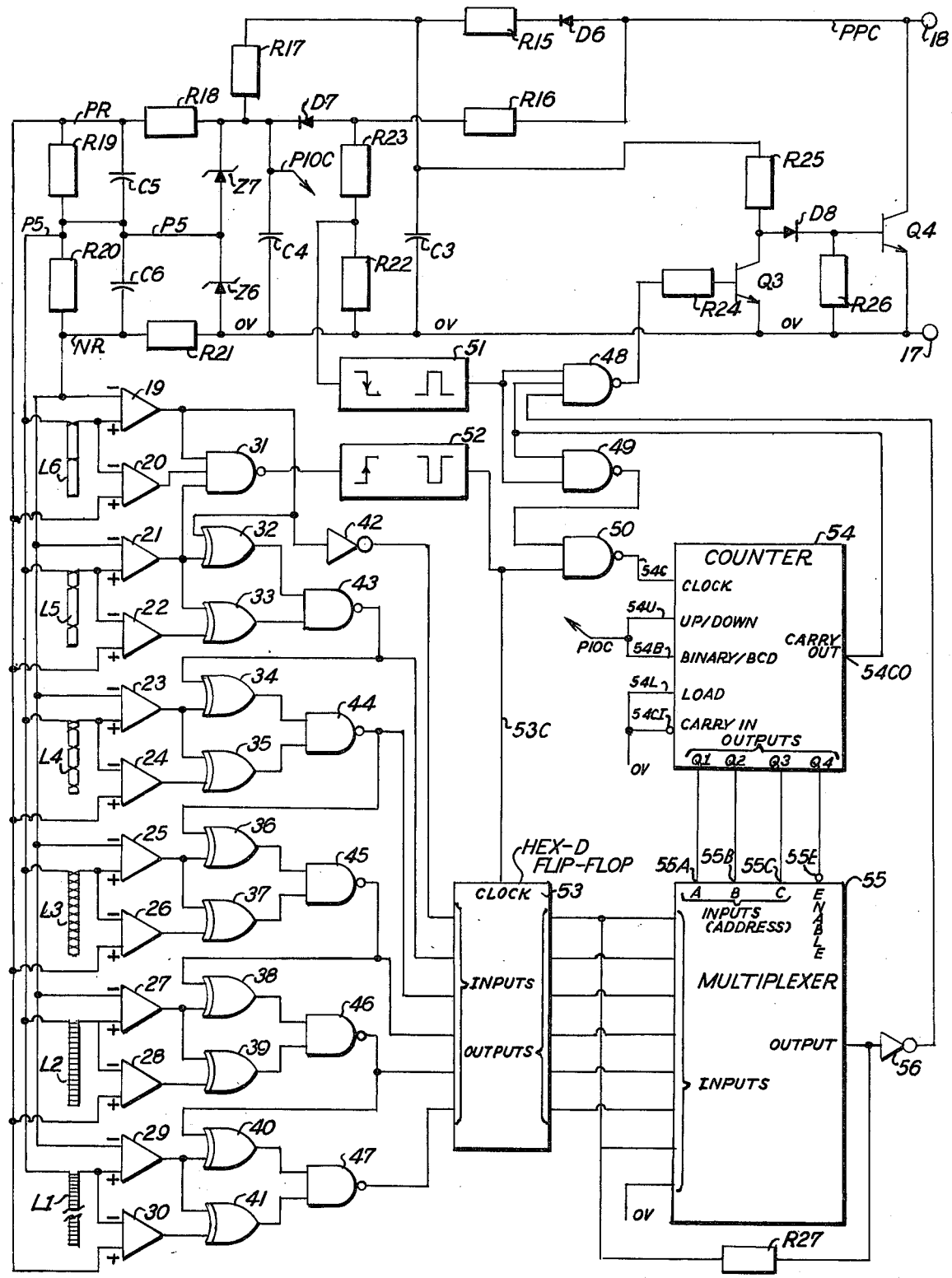

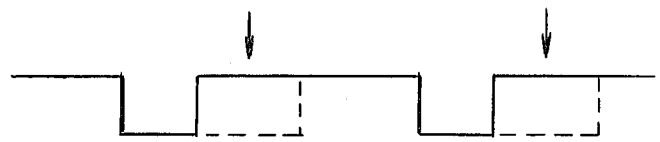
FIG. 9A
FIG. 9B
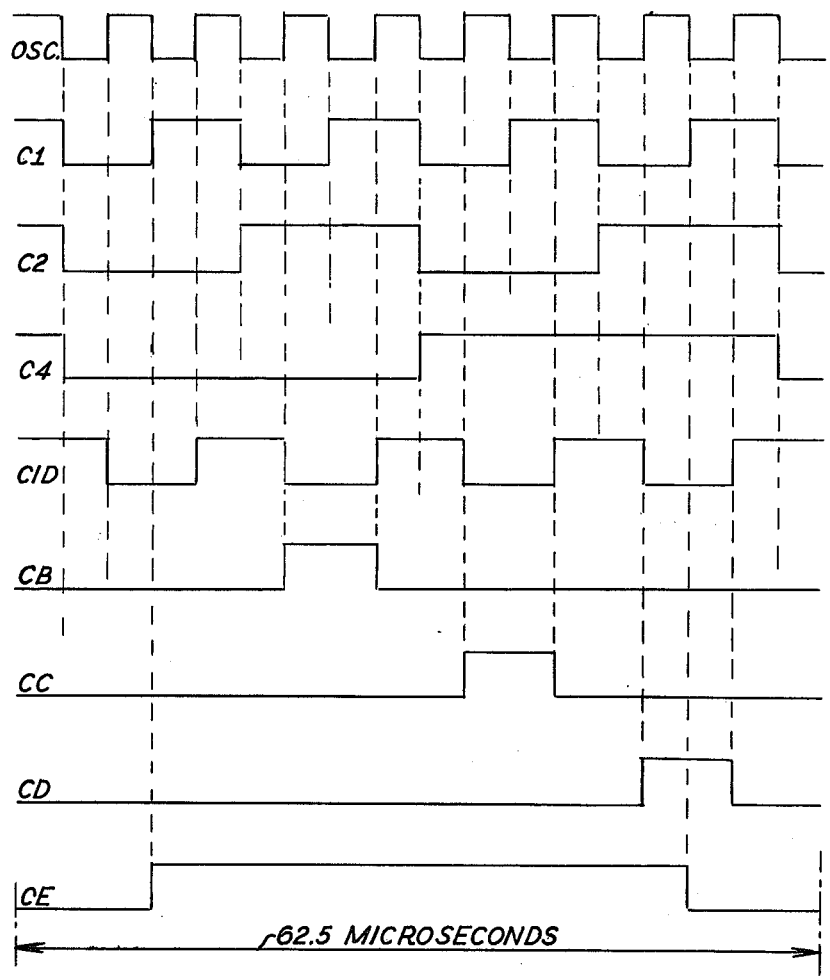
FIG. 10A

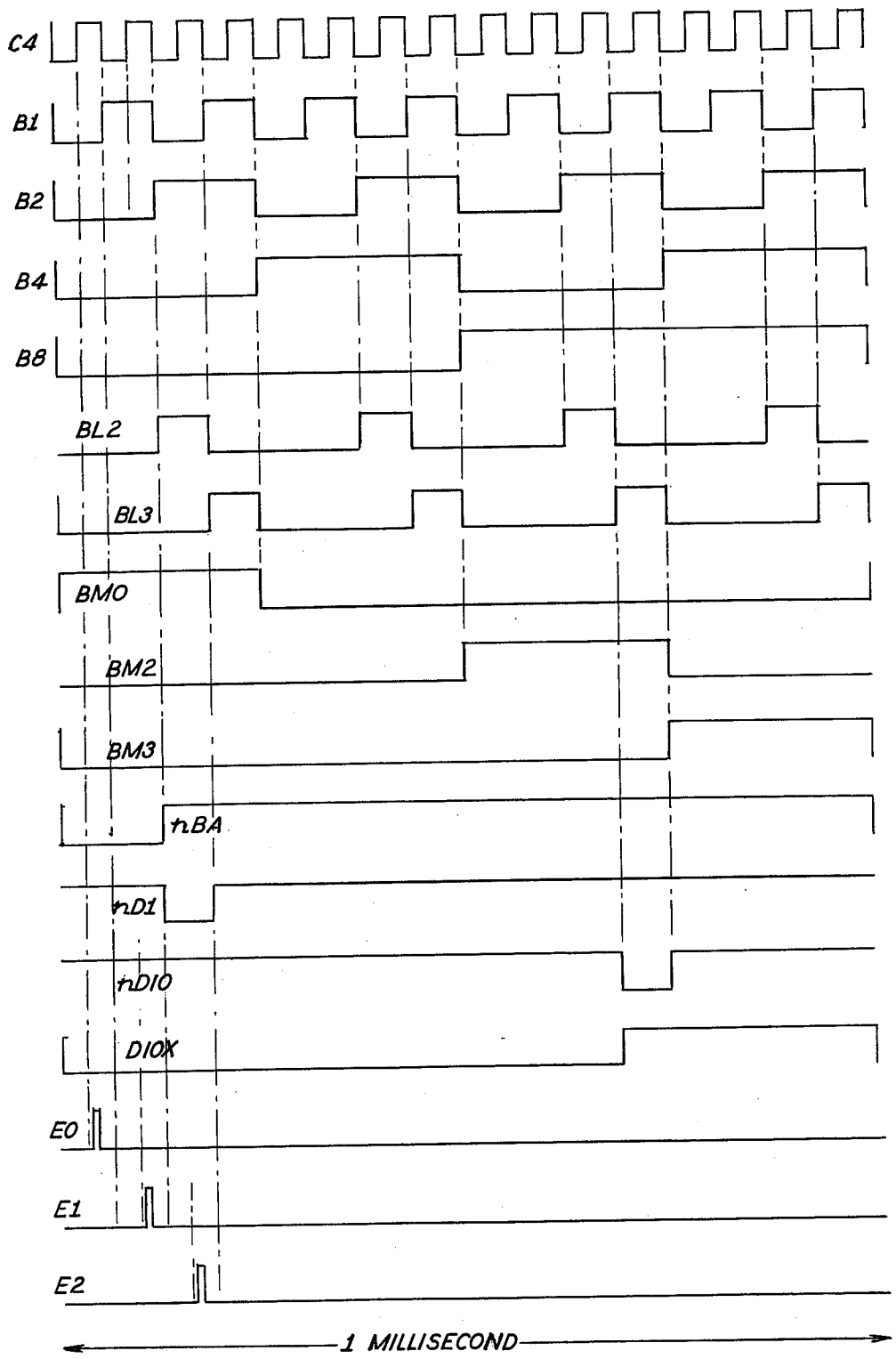

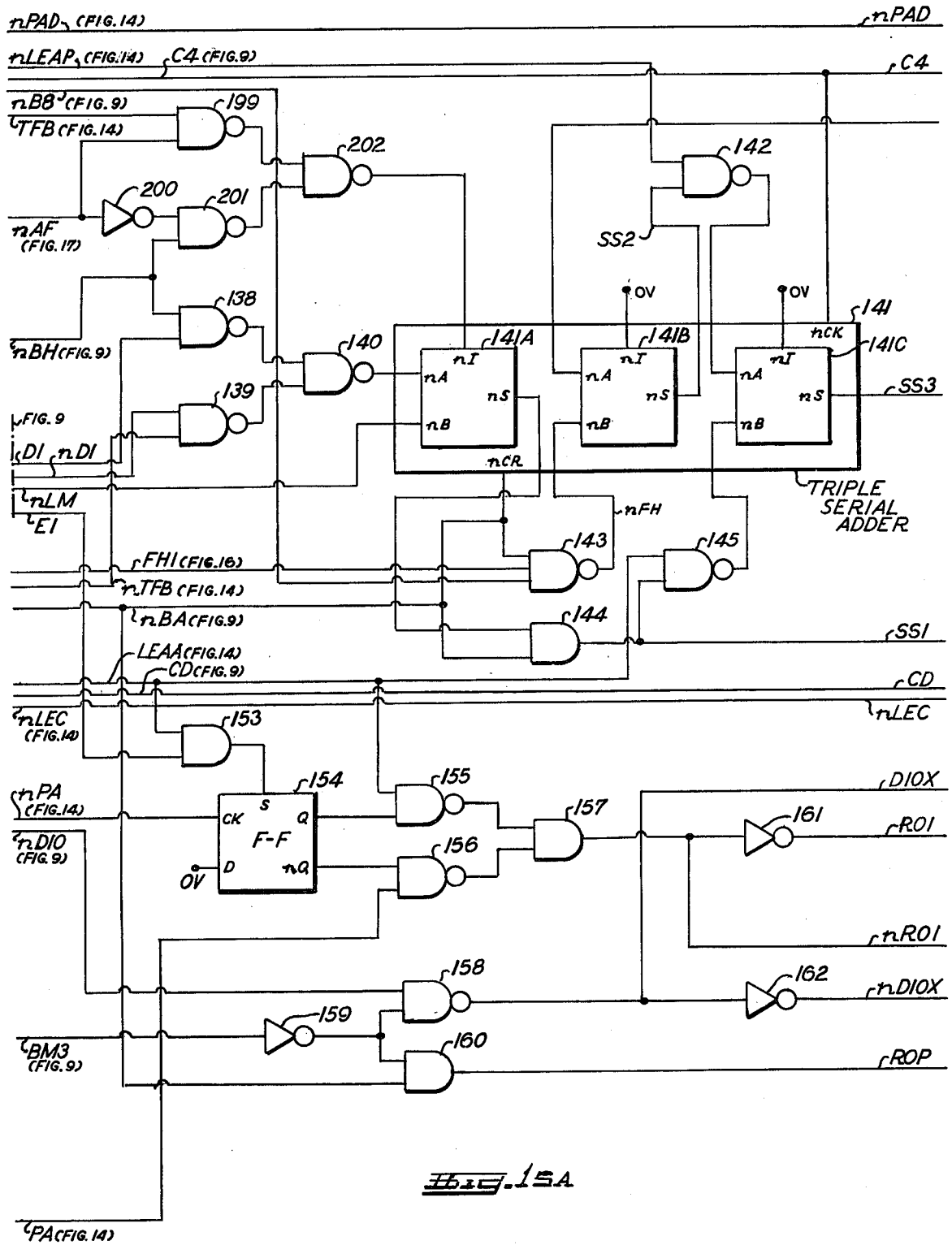

ACC = ACCUMULATOR

AR = ADDRESS REGISTER

FH = FLOOR HEIGHT (POSITIVE NUMBER)

LE = LOOPS EXCITED

LEA = LOOPS EXCITED AT FLOOR BEING ADDRESSED

LEB = LOOPS EXCITED AT FLOOR 16 FLOORS BELOW FLOOR ADDRESSED

LD = LOOP DISTANCE (DISTANCE FROM CAR TO PULSE CARD WHICH IS
EXCITING THE LOOPS) — CAN BE POSITIVE OR NEGATIVE

NA = NO ACTION

PA = PARTIAL AGREEMENT (FOUR LEAST SIGNIFICANT BITS) BETWEEN
ADDRESS AND TARGET

ROM = READ OUT MEMORY

FIG. 11B

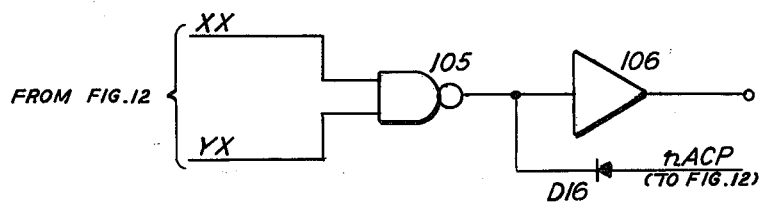

FIG. 13

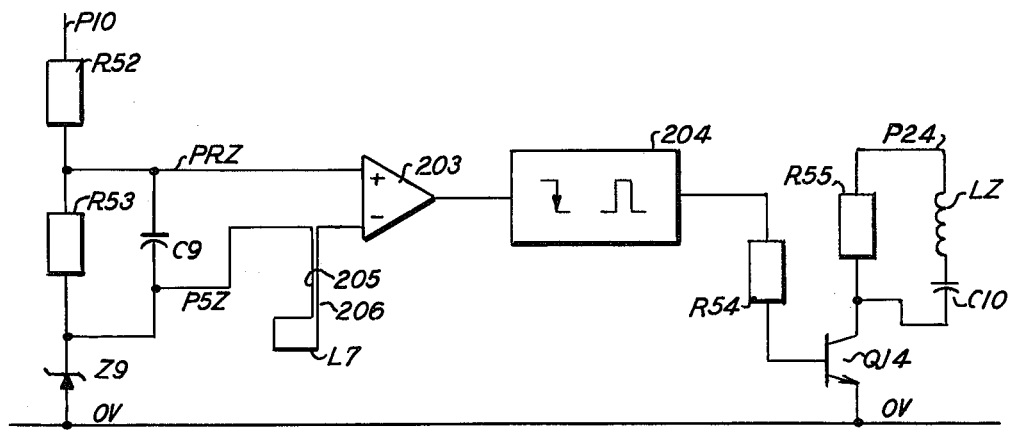

FIG. 12

APPARATUS FOR DETERMINING THE LOCATION OF AN ELEVATOR CAR OR SIMILAR VEHICLE

The present invention relates to elevator control systems and more particularly to means for determining the location of an elevator car along an elevator hoistway.

While the present invention is primarily intended for, and has been developed for use with elevator control systems, its principles are not limited to the elevator environment. As will be understood from the discussion below, the present invention has general applicability whenever it is necessary to determine the location of a vehicle, such as an elevator car, railroad car or any other movable element, that is arranged to move along a predetermined path of travel or "track."

A substantial portion of the control equipment for automatic elevators is contained in a device known as the selector. Generally, the selector produces two sets of inputs to the rest of the control equipment: identification of a target floor which is the floor the car is nearest to, or if the car is running, the nearest floor at which a stop could be or is being made; and dictation of what the speed should be at various distances from the target floor to control the deceleration, stopping, and relevelling if necessary.

The most well known type of selector is mechanically driven by the car motion, and reproduces the car motion to a much smaller scale. This selector moves a contact actuating or commutating carriage to follow the actual car position. For high speeds, there is usually an additional moving carriage on the selector which is advanced ahead of the point representing the actual car position to identify the target floor. An example of this type of selector is described in the Crane et al. Canadian Pat. No. 669,267.

These selectors have many disadvantages including lack of accuracy because of the reduced scale of motion and excessive mechanical complication, which makes manufacturing expensive and maintenance difficult. Additional hoistway devices are often required to get full scale accuracy for the last few feet of landing, and for the stopping and relevelling.

A further disadvantage is the excessive heights of the selector if the travel of the elevator is large, as in a very tall building.

Another method which has been used is to spread the selector equipment over several locations. For example, a stepping switch pr other similar notching device can be used on the control equipment to identify the target floor. Inductor relays on the car can be actuated by passive vanes in the hoistway to give periodic pulses specifying particular distances from the floors. One disadvantage of this system is the difficulty in keeping the stepping switch always in agreement with the car position. If it should get out of step, the pulses from the inductor relays can be misinterpreted, and the car can stop at the wrong floor and cancel the wrong call. Also, this system requires excessive hoistway space, and excessive field labour in installing and adjusting the hoistway vanes.

The use of active hoistway devices instead of passive vanes eliminates some of these disadvantages. Such a system is described in my U.S. Pat. No. 3,407,905. In this system, a plurality of active devices (electromagnetic coils) are arranged in stationary relationship with respect to a building along the elevator hoistway. The electromagnetic coils are spaced apart from one another in a line with each coil representing a different floor. A plurality of signal receivers (magnetically operated reed contacts) are arranged in a line movable with the car past the electromagnetic coils. The reed contacts on the car are therefore successively operated as the car passes an actuated electromagnetic coil to provide an indication of the distance of the car from the represented floor. The electromagnetic coils are selectively actuated by means of a stepping switch controlled by the uppermost and lowermost reed contacts. This switch is thereby stepped and the electromagnetic coils are successively actuated ahead of the car in the direction of car travel until there is reached a coil representing a floor at which the car is to stop. While this system has provided satisfactory operation in elevator hoistways of average speed, the amount of hoistway space required and the extent of hoistway wiring increases rapidly with the speed of the elevator because of the larger slow-down distance.

Attempts to make a solid state selector have generally involved a pulse generator driven by the car motion, which drives a counter. The hoistway travel is divided into small units of typically 0.01 ft., and the counter identifies the location of the car in the hoistway to the nearest 0.01 ft. The counter may require a large number of binary digits to accommodate the full travel of the elevator. Such a system is described in the Dixon et al U.S. Pat. No. 3,773,146.

The major disadvantage of this system is that the counter is vulnerable to induced electromagnetic spikes from adjacent heavy power equipment, such as motor generator starting contactors, or elevator brake contactors. A single spike can alter one or more digits of the counter. The false altering of one of the more significant bits could produce an error of 100 feet or more. Also, the counter loses its synchronism with the car after a power interruption.

This disadvantage makes it necessary to provide frequent check points in the hoistway to set the counter to the correct count if it has come out of synchronism, or to compensate for cable slip. However, an error caused by interference remains uncorrected until the next check point is reached. Each check point must be programmed to set all of the numerous digits of the counter to the correct state. This programming may have to be trimmed from time to time due to settlement of the building or to the decrease in diameter of the machine drive sheave as it wears, unless the pulse generator is driven directly by car motion rather than by the elevator hoist machine.

Another disadvantage is that this system must work with small increments of hoistway travel such as 0.01 ft., in order to permit adjustment of the landing accuracy at each floor. If, for example, the increments were 1 inch, a particular floor might fall exactly half way between the two adjacent numbers, and the adjustment would permit the car to land either ½ inch high or ½ inch low, but not level. The small increment causes many digits to be required in the counter, in the check point programming, and also in the programming of the floor heights which are stored in a memory.

An object of the present invention is to provide improved apparatus for determining the location of an elevator car or similar vehicle. A more particular object of the present invention is to provide apparatus for determining the location of an elevator car, which apparatus avoids the various disadvantages of the prior art elevator selectors noted above.

The foregoing objects, as well as other objects which will become apparent in the discussion that follows, are achieved, in accordance with the present invention, by means of novel and improved apparatus essentially comprising:

(1) a plurality of signal transmitters which are spaced apart in the direction of vehicle travel;

(2) a plurality of signal receivers, also spaced apart in the direction of vehicle travel;

(3) a device for controlling the signal transmitters, to cause them to transmit signals, one transmitter at a time, with the respective transmissions occurring in a constantly repeating sequence; and (4) a device, responsive to the receivers, for determining the location of the vehicle along its path of travel.

According to the present invention, either the signal transmitters or the signal receivers may be arranged in stationary relationship with respect to the ground along the path of vehicle travel, while the others (receivers or transmitters) are arranged on the vehicle. Preferably, the active devices, i.e., the transmitters, are arranged on the ground and the receiving devices are arranged on the vehicle along a line extending in the direction of vehicle travel.

The apparatus according to the present invention operates in the following manner: The signal transmitters successively transmit signals, one at a time, in a constantly repeating sequence. Since the transmitters are only capable of transmitting signals to an immediately adjacent receiver, a signal will be transmitted from transmitter to receiver only when a transmitter that is adjacent a receiver is caused to transmit. Because the sequence of transmissions is known, it is possible to determine which transmitter transmitted a signal that was actually received by a receiver. And because the positions of the receivers, relative to the vehicle, are known, it is possible to determine the location of the vehicle relative to the transmitter whose transmission was received.

Thus the apparatus according to the present invention is similar in some respects to the elevator car position determining system disclosed in my aforementioned U.S. pat. No. 3,407,905. However, whereas in the system diclosed in this patent the electromagnetic coils (signal transmitters) are energized one at a time by a stepping switch in dependence upon the position of the elevator car, the signal transmitters of the present invention are successively and repeatedly energized in a known sequence independently of the actual position of the vehicle. In this way, the system according to the present invention is always capable of determining the location of the vehicle, notwithstanding the speed of the vehicle, provided that the sequence of transmissions occur at a repetition rate which assures that the movement of the vehicle between two successive signal receipts by the receivers is within an allowable tolerance. Thus when the apparatus in accordance with the invention is employed in an elevator control system to determine the location of an elevator car for example, an increase in speed of the elevator does not result in any increase in the complexity of the apparatus as is the case with the system described in my U.S. pat. No. 3,407,905.

The apparatus according to the present invention is also not subject to the disadvantages of the solid state selector described in the aforementioned U.S. pat. No. 3,773,146. Rather than dividing the path of vehicle travel into equal units of distance which are small enough to permit the vehicle (elevator car) to be stopped at a station (floor) with the requisite landing accuracy, the apparatus of the present invention permits the units of distance to be wider because all measurements are made relative to hoistway transmitters located at each floor which are individually adjustable in elevation. Furthermore, since the position of the vehicle is determined anew after each cycle or sequence of signal transmissions, errors which may result from electromagnetic spikes or power interruptions are promptly corrected. And finally, since the apparatus according to the present invention is arranged along the entire length of the path of vehicle travel, it does not need to be reprogrammed or trimmed from time to time as may be the case with the system disclosed in the U.S. pat. No. 3,773,146.

Particular apparatus which functions in accordance with the principles of the present invention will now be described with reference to an elevator car arranged to travel in a hoistway and stop at a plurality of floors. While such apparatus is the preferred form of the present invention, it will be understood that this invention is not limited to the elevator art and, in fact, has broad applicability to the problem of determining the location of a vehicle arranged to move along a predetermined path.

According to the invention, an active device, which will be referred to as a PULSE CARD, is located at each floor in an elevator hoistway. In plan view, these cards are all in the same location. In elevation, they are situated the same dimension above each corresponding floor of the building.

A receiving device called a LOOP STICK is mounted on the elevator car. It occupies very little space as seen in plan view, but extends for a substantial distance vertically. It is mounted off one side of the car so that it runs close to, but with sufficient clearance from, the pulse cards. The vertical length of the loop stick is ideally as long as possible without interfering with the pit and overhead clearances, and generally is greater than the normal distance between adjacent floors.

The loop stick contains a multiplicity of elongated signal-turn loops of wire; each loop extends essentially from the top to the bottom of the stick. Each loop has at least one cross-over, or twist, where the two vertical conductors cross over in a substantially horizontal line so as to interchange their positions.

The vertical position of each pulse card is such that when the car is level at the corresponding floor, the pulse card is centered on the vertical length of the loop stick.

Each pulse card contains one or two coils which, when de-energized, induce a small voltage into the loops, provided that the loop stick is adjacent to the pulse card. This is the result of the magnetic flux from the coil or coils passing through the loops. Ideally, there are two coils in each pulse card and the loops are arranged to move between the two coils. The pulse card may then be slotted to let the loop stick project into the pulse card, but with suitable clearance between the stick and the card; alternatively, the coils may project outwardly from the pulse card. Because of the twists in the loops, the induced pulse in any loop can be positive or negative depending on the part of the stick that is adjacent to the pulse card.

The stick is divided into a number of generally equal cells; the central three cells may be smaller than the others. Each division between adjacent cells has one crossover of the two wires of one of the loops. For each cell on the stick, there is a unique code of positive and negative pulses which are induced in the loops by the de-energization of coils on a pulse card adjacent to that cell. A form of Gray coding is used so that the code for any two adjacent cells differs by only one bit.

Thus, whenever a pulse card adjacent to the stick has its coils de-energized, the resulting loop pulses give a coded reading of the distance between the car floor and the building floor which corresponds to the pulse card.

The pulse cards are arranged to energize and deenergize their coils in sequence in a rapidly repeating cycle. After one complete cycle, one or more pulse cards will normally have caused voltages to be induced into the loops. The location of the car in the hoistway is then known relative to one or more floors. The floor itself can be identified by which part of the cycle resulted in pulses being induced in the loops; the distance of the car from this floor can be decoded from the pulses induced in the loops.

This measurement of car position is updated at each new cycle. At low speed, numerous cycles may occur before the car has moved through one cell, and each new reading merely confirms the previous reading. Any disturbance caused by a single spike of electromagnetic interference can give a wrong reading only until the next cycle, at which time the correct reading is again obtained. At high car speed, the car may pass through several cells between adjacent cycles, but at each updating, a true reading will be obtained even though it is several cells different than the previous reading.

An up/down binary counter is used to specify the target floor. Sufficient digits are used to allow one specific state of the counter for each floor served. For example, a 5-digit counter can be used for up to 32 floors. A computing program is used which calculates the target distance, which is the distance between the car and the target floor. This calculation is repeated at the same rate as the cyclic deenergization of the coils on the pulse cards so that the target distance is updated after each cycle of the pulse cards.

In order to calculate the target distance, the distances between the various adjacent floors must be known, unless the car speed is so low that the slowdown distance required is less than half the vertical length of the loop stick. These floor heights are stored in a memory. When the loop stick is adjacent to the pulse card for the target floor, the target distance can be obtained directly from the loop pulses without the need for knowing the floor heights. Otherwise, the appropriate floor heights must be added to the distance obtained from the loop pulses.

A circuit is provided for setting the target floor to agree with the car's position in the hoistway, to the nearest floor, when required. This would be required after a power failure, but it is also useful to make the target floor follow the car when it is operated at low speed for maintenance and inspection. The target floor then changes when the car is approximately half way between floors. Also, it is desirable to activate this circuit when the car is stopped at a floor to assure that any electromagnetic disturbance which might cause the target floor counter to jump to a wrong condition will be quickly followed by correction after the next cycle of de-energization of the coils on the pulse cards.

This circuit uses the pulses induced in the loops. If only one pulse card is active on the loop stick, the timing of its excitation of the loops specifies the floor. If two or more pulse cards are active on the stick, a comparison is made between the loop pulses resulting from one pulse card's coil de-energization and the loop pulses resulting from the previous pulse card's coil de-energization as stored in a temporary memory. From this comparison, the nearer floor of the two can be determined.

When the car commences a normal run, the target floor is advanced one step in the intended direction of motion at the instant the car starts. This enables other circuits, which are not part of this disclosure, to examine conditions one floor ahead to see if a stop is required there. If not, the target floor is advanced one additional floor, and the conditions are examined at this new floor to see if a stop is required there. This process continues until the target distance exceeds the slowdown distance, which is adjustable to suit the car speed. A timer adjusts the rate of these advances.

When the car is running at full speed, and no stops are required, the target floor advances one step whenever the target distance has decreased to a value equal to or slightly greater than the slowdown distance.

When a requirement to stop is detected at a target floor the target floor stops advancing and holds this state which thereby specifies the floor where the stop is required. The target distance then decreases as the car approaches this floor and eventually reduces to zero.

There is a small area extending slightly above and below each loop cross-over where the loop pulse amplitude is insufficient to be detected. This is because some of the magnetic flux passes through the loop above the cross-over, and some of it passes through the loop below the cross-over. When the coils on the pulse card are deenergized, the polarities induced in the two parts of the loop are opposite and tend to cancel each other out.

Since only one loop crosses over at any point on the loop stick, only one bit of the coded information can be indeterminate, at most. A circuit is provided which recognizes this indeterminacy in any loop pulse, and arbitrarily interprets it as if it were a proper loop pulse in the cell immediately below. This makes the actual switch-over point of the coded distance occur slightly above each cross-over. A slight vertical adjustment of the loop stick relative to the car, or a slight change in the dimension which locates each pulse card above each floor, can compensate for this shift in switching point.

It is fairly obvious that the pulse cards should be sequenced to de-energize their coils in either a descending or an ascending order, rather than jumping around in some other pattern. This simplifies the computing circuits. Although it might further simplify the computing circuits to use the ascending order of de-energization when the car is going up, and the descending order of de-energization when the car is going down, the extra complication in the pulse cards makes this inadvisable. Although either direction of sequencing is feasible, the ascending sequence will be used in this description.

The use of a single direction of sequencing permits an important simplification in the hoistway wiring. A pair of wires is used to feed pulsed power to all of the pulse cards in parallel. A capacitor on each pulse card filters this pulsed power to provide a steady direct current for the circuits on the card. The pulses on these two wires are used to supply clock pulses to a counter on each pulse card. Thus each counter advances by one step whenever the power supply has a pulse.

Periodically, a pulse of significantly different magnitude is transmitted to all of the pulse cards. This causes each counter to be loaded to a programable state, so that any desired displacement is maintained between the various counters. Each counter causes de-energization of the coils on the pulse card at a specific count, which is the same for all pulse cards. With suitable programming, the desired sequence of coil de-energization is thus achieved. In this way, the entire hoistway wiring may consist of only one pair of wires feeding the pulse cards.

A further simplification can be made in the pulse cards by permitting only 16 different settings on the programming of the pulse cards. Then a single integrated circuit is sufficient. If there are more than 16 floors, two or more pulse cards may de-energize their coils at once, but they are programmed so that they are 16 floors apart. Hoistway memory switches can then be used to indicate which part of the hoistway the car is in, so that it is known which pulse card actually causes the pulses in the loops. For example, a single memory switch could indicate whether the top of the loop stick is above or below the 16th floor pulse card, for installation with more than 16 floors, but not over 28 floors, or perhaps 29 or 30 depending on the floor heights. This is because near the middle of the building, two or three pulse cards for the lower 16 floors might still be adjacent to the loop stick when its top is slightly above the 16th floor, and hence be confused with floors 29, 30 and 31.

Generally it is required that there be sufficient pulse cards in the hoistway so that for any elevation of the car, at least one pulse card can induce pulses into the loops. With normal floor heights this is automatically achieved. Occasionally, an extra pulse card or two may have to be provided to fill in a gap between two widely spaced floors. These cards would represent "dummy" floors at which no stops would normally be made.

However, it is not necessary to provide a complete set of dummy floors in a long express zone where there are no entrances. Sufficient dummy pulse cards are needed at each end of the express zone only to assure that a normal slowdown can be made at the floors at each end of the express zone.

The computing circuit is arranged so that if no loops are excited, as would occur in an express zone, full speed is called for, and the previous direction of travel is retained.

The magnitude and duration of the pulses induced in the loops may be rather small, and it is desirable to detect, amplify and memorize them before transmitting the information from the car to the rest of the control equipment in the machine room. It is also convenient to decode the pulses into binary form on the car before transmission to the machine room.

The computing circuits can be simplified by using sequential rather than parallel calculating, and thus the coded information from the loops must be converted into sequential form. If this is done on the car, the information can be transmitted over a single pair of wires in the travelling cables, rather than on separate wires for each bit.

Thus in the preferred embodiment of this invention only two wires are required in the hoistway, and only two wires are required to the car, for up to 16 floors. With over 16 floors, further wires are required in the hoistway because of memory switches in the hoistway actuated by something on the car, such as permanent magnets.

Since a failure in the solid state circuits could falsely cause the car to move in an attempt to land or relevel with the doors open, when it is in fact not safe to do so, further over-riding protection is required to restrict the area in which the car can move with the doors open. Magnetic switches on the car could be actuated by vanes in the hoistway for this purpose.

It is also possible to have further loops on the loop stick for the purpose of defining zones in which landing and relevelling is permitted with the doors open. Fail-safe amplification of the pulses induced in these loops can be achieved by capacitive-coupled amplification and redundancy. This eliminates the need for hoistway vanes.

For a more complete understanding of the present invention, reference may be had to the following detailed description taken in conjunction with the accompanying figures of the drawings, in which:

FIG. 1 is partially isometric and partially elevational view of a typical elevator installation showing the arrangement of the components which comprise this invention:

FIGS. 2a, 2b, 2c and 2d show four examples of how the target distance is calculated;

FIG. 3 shows the voltage waveform of the pulsed power applied to the pulse cards;

FIG. 4 shows a circuit suitable for the pulse cards;

FIG. 5 shows an isometric view of a pulse card and one possible arrangement of the loop stick;

FIG. 6 shows the layout of the loop wiring for a loop stick containing six loops; the Gray code and the binary code for the various cells in the loop stick are shown in tables 1 and 2, respectively;

FIG. 7 shows a circuit for detecting, amplifying, decoding and multiplexing the loop pulses;

FIG. 8A shows the voltage waveform of the two wires connecting the loop stick card to the machine room;

FIG. 8B shows the multiplexing sequence for the signals on the two wires connecting the loop stick card to the machine room;

FIGS. 10A and 10B show some of the voltage waveforms associated with FIG. 9;

FIG. 11B is a table of abbreviations used in the flow chart of FIG. 11A;

FIG. 13 shows a circuit for further decoding from two-digit octal into one line per floor and for amplifying these lines to drive relays or other devices;

FIGS. 15A and 15B show the main part of the circuit for calculating the target distance;

FIG. 18 shows a circuit for energizing a landing zone relay when the car is within a predetermined distance of any floor, as detected by a zone loop on the loop stick.

Figure 9A:
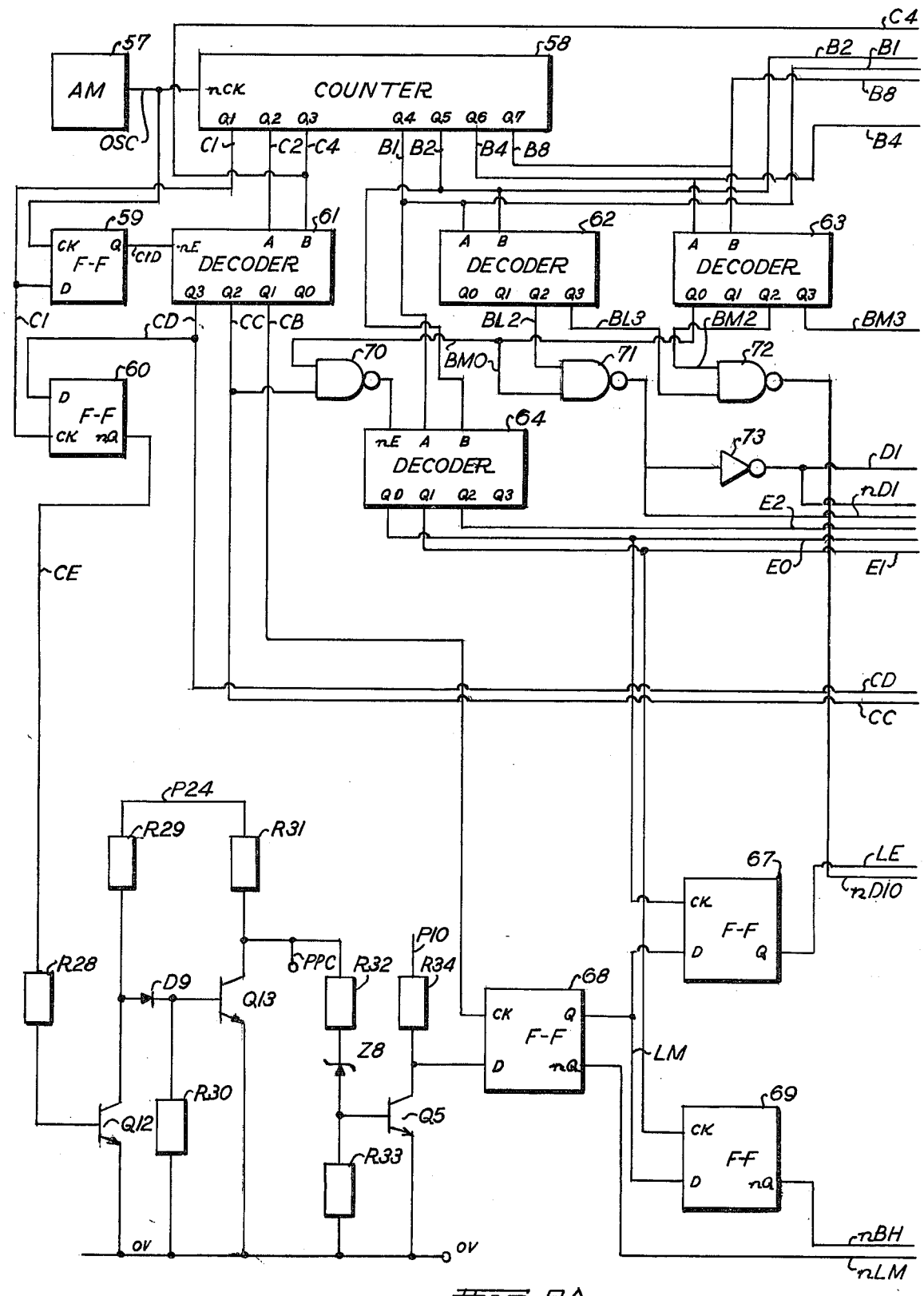
FIGS. 9A and 9B show the circuits for creating the pulsed power supplies for the pulse cards and the loop stick card.

In FIG. 1, an elevator car 1 is shown suspended by hoist cables 2 which pass over drive sheave 3 which is driven either directly or through gears by hoist motor 4. The other end of the hoist cables connect to a counterweight 5. A controller 6 contains the usual equipment to drive hoist motor 4, possibly via a motor generator set in the familiar variable voltage, or Ward-Leonard system. Controller 6 also contains equipment for recording and cancelling car and hall calls, for determining when the car should go up or down to answer these calls, and for determining when stops should be made for car and hall calls. Although a single car is shown, the invention is equally applicable to a bank of elevators in which each car has a controller 6, but in which the hall calls may be processed in a separate item of control equipment which is common to all cars, and not shown in FIG. 1. Door control equipment is also contained in controller 6.

The equipment described in the preceding paragraph contains essentially all of the control equipment of a normal elevator installation with the exception of that part of the control equipment which is commonly called a selector. The remaining equipment in FIG. 1 represents the solid state selector system to be described hereinafter.

The purpose of FIG. 1 is to show the general arrangement of the components which constitute this invention. Five pulse cards PC1, PC2, PC3, PC4 and PC5 are shown in a vertical column in approximately the elevation they would require relative to the 5 floors shown. Additional similar pulse cards would be used for additional floors, although only five are shown. Each pulse card contains two coils 15a and 15b.

The car is shown level at the 5th floor. Loop stick LS is mounted on the side of car 1 so that it passes through the slots in the pulse cards, between the coils 15a and 15b. The individual loops are not shown in FIG. 1. With the car level with the 5th floor, pulse card PC5 is situated at the centre of loop stick LS. Similarly, at any other floor, the corresponding pulse card is situated at the centre of the stick when the car is level at that floor.

The electronic circuits required on the car are contained in a card LSC which is attached to the loop stick. The remainder of the electronic circuits are represented by box 9 in FIG. 1 which would normally be situated in the machine room. Electrical connection between card LSC and box 9 is made by a shielded pair of wires 7, which is shown in three parts: 7A between card LSC and junction box 8A under the car; 7B in the travelling cable; and 7C between hoistway junction 8B and the machine room.

A further pair of wires PP and OV connect the pulse cards to box 9. The various connections between controller 6 and box 9 are shown by a single line 14 in FIG. 1.

FIG. 2 shows four examples of the method of determining the target distance TD from the dimension $d$ obtained from the decoding of the loop pulses, and the floor heights such as $f_5$ between the 5th and 4th floors, or $f_4$ between the 4th and 3rd floors. In FIG. 2a the target is the 4th floor and the car is between the 2nd and 3rd floors. In FIG. 2b, the target is the 5th floor and the car is between the 3rd and 4th floors. The difference between FIGS. 2a and 2b is that in FIG. 2a the car is close enough to the 3rd floor to get a reading there so that only one floor height needs to be added. In FIG. 2b, the car is too far from the 4th floor, and thus two floor heights must be added, and the dimension $d$ has to be subtracted. FIGS. 2c and 2d show two additional cases, where the target floor is below the car. In FIG. 2c it is the 1st floor, and in FIG. 2d it is the 2nd floor.

FIG. 3 shows the voltage waveform of the pulsed power applied to wire PP, with respect to wire OV which would normally be at ground potential. This waveform consists of one pulse with a voltage of magnitude V2 followed by 15 pulses of lesser magnitude V1, and then repetition of this sequence. Suitable values of V2 and V1 might be 24 and 12 volts respectivly. The pulse of magnitude V2 need not remain at the V2 level for the entire duration of the pulse. It can be a brief spike at the beginning of the pulse, and descend abruptly to the lower level or exponentially as shown in FIG. 3.

FIG. 4 shows the circuit for a pulse card. External connection to this card is made via terminals 12 and 13 from hoistway wires OV and PP respectively. The same names OV and PP are used in FIG. 4 for these wires on the pulse card.

During a positive pulse of magnitude V2 or V1, current flows from PP through resistor R4 and diode D1 into capacitor C3 to restore the energy which was lost in the preceding period between pulses. Zener diode Z2 prevents capacitor C3 from being charged higher than 10 volts, or whatever other voltage is chosen for operating the counter 16. During the period between pulses, capacitor C3 acts as a source of energy to maintain approximately 10 volts on P10H, and diodes D1 and D2 prevent current from flowing back into line PP.

An integrated circuit counter 16 has its power inputs $V_{DD}$ and $V_{SS}$ connected to P10H and OV respectively, although this is not shown in FIG. 4. FIG. 4 is shown using a CMOS counter of type 4029; other types could be used. The 4209 type, which is usable in either an up or down counting mode, and also usable as a binary counter or a binary coded decimal counter, is actually more elaborate than needed, but it is used because its carryout output eliminates the need for a further gate.

Input 16B is connected to P10H to achieve binary counting rather than binary coded decimal counting. Input 16U is connected to P10H to achieve up counting rather than down counting.

The "carry-in" input 16CI is connected to OV to make the counter advance one step at each positive transition of the clock input 16C.

At the commencement of each pulse, of magnitude V2 or V1, input 16C is changed from low to high by current flowing through resistors R4, R5 and R6. This causes the counter to advance one step. A small capacitor C2 may be used to prevent spikes of voltage from falsely clocking the counter. Diode D1 prevents the positive end of resistor R5 from exceeding the P10H voltage by more than one diode drop. Resistors R5 and R6 have a ratio of approximately 1:10 in their resistance to prevent input 16C from becoming more positive than P10H, which might damage the counter. Resistor R5 could be replaced with a diode.

At the commencement of each pulse of magnitude V2, load input 16L of counter 16 is made high by current flowing through resistor R1, zener diode Z1, and resistors R2 and R3. This causes the counter to be set, or loaded, to a particular count as specified by inputs 16L1, 16L2, 16L4 and 16L8. This over-rides the effect of input 16C going high. The purpose of zener diode Z1 is to assure that this loading does not occur with a pulse of magnitude V1. Diode D2 prevents the positive end of resistor R2 from going more positive than P10H by more than a diode drop, and resistors R2 and R3 attenuate this voltage slightly to protect input 16L from voltages higher than P10H. A small capacitor C1 may be added to prevent false loading of the counter due to voltage spikes.

Input 16L1 is caused to be held high by resistor R7 if switch S1 is open, or low if switch S1 is closed. Similarly resistors R8, R9 and R10, and switches S2, S4 and S8 control inputs 16L2, 16L4 and 16L8. These switches can be set in any one of 16 different ways to programme this pulse card to load its counter to any one of the 16 possible counts, when a pulse of magnitude V2 occurs.

When counter 16 is at step 15 (the last step of 16 steps numbered 0 to 15) carry output 16CO is low. For all other states of the counter, output 16CO is high. When output 16CO is high, transistor Q1 is turned on by current flowing through resistor R11 into the base of Q1. This holds transistor Q2 turned off because its base is grounded through resistor R13, and no appreciable current flows through diode D3 since Q1 absorbs all of the current flowing through resistor R12.

When the counter steps to step 15 at the beginning of a pulse on PP, output 16CO goes low and turns transistor Q1 off. This causes transistor Q2 to turn on because of current flowing through resistor R12, diode D3, the base of transistor Q2, and resistor R14. Some current also flows through resistor R13.

When transistor Q2 turns on, current starts to build up in coils 15a and 15b, and this current flows through trasistor Q2 and resistor R14. The inductance of these coils causes the current to build up exponentially. When the current has reached the desired level, the voltage drop across resistor R14 is sufficiently high to cause the voltage on the base of transistor Q2 to reach the zener voltage of zener diode Z3, less the forward voltage drop in diode D3. The circuit then acts as a constant current source to maintain the desired current in coils 15a and 15b regardless of temperature, and regardless of the voltage variations in line PP during pulses of either V1 or V2 magnitude.

When the pulse on line PP ends, the coils 15a and 15b are de-energized, and the inductive kick drives the upper end of zener diode Z5 highly positive. Two zener diodes Z4 and Z5 are used in series to get, in effect, a single zener diode with a higher zener voltage than what is readily available. For example, 180 volt zeners could be used to get the equivalent of a 360 volt zener. These zeners act through the base of transistor Q2 to clamp the discharge voltage of the coils to a value below the permissible collector-emitter voltage of high voltage transistor Q2.

The magnetic flux decays rapidly, and induces pulses in the loops which might typically be of about 0.5 volts magnitude and about 5 microseconds duration. Stronger or longer pulses could be obtained by heavier components, but these values are quite adequate to be easily detected. Although pulses of sufficient strength can be obtained with air-core coils as shown on FIG. 5, better results can be obtained by winding the coils on ferrite material. During discharge, the coil current flows through diode D5 and resistor R14.

FIG. 5 shows an isometric view of a pulse card PC with its two coils 15a and 15b. Other components on the pulse card such as the counter, transistors and switches, are not shown.

One possible mechanical arrangement for the loop stick is shown in FIG. 5. A series of blocks 13 made from non-magnetic, non-conducting material, are sandwiched between two angles 11 and 12 also made of non-conducting, non-magnetic material. The small gaps between these blocks carry the crossover wires of the loops. The main vertical portions of the loops are held between the two angles, along the edges of the blocks.

A metallic channel 10 can be used for mechanical support if desired. It also tends to shield the loops somewhat, with no appreciable effect on the pulses induced by the pulse cards.

FIG. 6 shows the loop wiring for a loop stick with 6 loops. The six loops would be wound one on top of the other, but are shown separated in FIG. 6. Because of the low voltage, very little insulation is needed on the loop wires, and ordinary magnet wire is quite suitable.

Loop 6 has 1 twist, loop 5 has 2 twists, loop 4 has 4 twists, loop 3 has 8 twists, loop 2 has 16 twists and loop 1 has 31 twists. There are 63 cells. Polarity signs are shown in each position of each loop in FIG. 6, to indicate the polarity of the induced pulses.

Table 1 shows the Gray coded output of pulse detecting circuits for each loop. A negative pulse is considered to be equivalent to a 1 and a positive pulse is considered to be a 0.

Table 2 shows the binary coded output of the pulse detecting circuits. Each line in table 2 is the result of a direct conversion from Gray code to binary, except that bit 6 is inverted. The rule for this conversion is that each binary bit is the same as the corresponding Gray bit if the next more significant binary bit has been decoded as a 0; and similarly each binary bit is the opposite to the corresponding Gray bit if the next more significant binary bit has been decoded as a 1. Higher numbered bits are more significant.

Inspection of tables 1 and 2 in FIG. 6 should confirm this rule, with the exception of binary bit 6 which has been deliberately inverted. The inversion of bit 6 makes it into a sign bit which is 0, denoting positive numbers, for the upper half of the stick, and 1, denoting negative numbers, for the lower half of the stick. The central cell has binary number 000 000.

The negative binary numbers for the lower half of the stick are in the familiar 2's complement form where binary 111 111 is equivalent to decimal −1 and binary 100 001 is equivalent to decimal −31. A negative binary number in 2's complement form can be converted to the corresponding positive binary number by inverting all bits and then adding 1.

Thus the binary number obtained from decoding the loop pulses shows the number of cells between the center of the loop stick and the cell being excited by a pulse card.

The central cell should be about 1 inch in height so that the binary number 000 000 indicates that the car is within plus or minus ½ inch from level. The pulse cards can easily be located to achieve this at each floor. Then, when the car is landing or relevelling, the transmission of binary number 000 000 from the loop stick card to the penthouse indicates that the car has reached the point, usually about ½ inch from level, where the speed regulator must bring the speed to zero, and the brake must be applied.

If desired, the cross-over of loop 6 at the bottom of the middle cell, and the cross-over of loop 1 immediately above the central cell, can be made vertically adjustable over a small range. This permits adjustment of the point at which the final stop is initiated.

The remainder of the cells should preferably be all made of equal height to simplify the computation. With the 63 cells obtained from 6 loops, a cell height of 2 ½ inches is particularly suitable, because it results in a total loop stick length of slightly over 13 feet. This length exceeds the floor to floor distance in most buildings, but presents no problems with pit or overhead clearances on most elevator cars.

If the cell heights are 2 ½ inches, it may be desirable to make the cells immediately above and below the central cell 2 inches instead of 2 ½ inches. This makes all switching points, other than the ½ inches stopping points, multiples of 2 ½ inches.

It should be noted in FIG. 6 that loops 1 to 5 extend slightly farther at the ends of the stick, than loop 6. This is to prevent false readings when the end of the loop stick first enters a pulse card, where some loop pulses might get detected before others. No decoding is performed unless there is a pulse of either polarity detected in loop 6, or a negative pulse in loop 5. The negative pulse in loop 5 is required as an alternative to cover the cross-over of loop 6 where a pulse cannot be detected.

FIG. 7 shows the circuit for the card LSC which is attached to the loop stick. The two wires constituting the shielded pair 7 in FIG. 1 connect to terminals 17 and 18 on FIG. 7. Terminal 17 is connected to line OV on card LSC, which is preferably at ground potential. Terminal 18 is connected to line PPC. Lines PPC and OV are supplied with pulses of power via shielded pair 7, with line PPC positive with respect to OV during each pulse.

While PPC has a positive pulse on it, current flows through diode D6 and resistor R15 to restore the charge on capacitor C3. During the period when there is no pulse, capacitor C3 acts as a source of power to supply the circuits on card LSC. Diode D6 prevents the capacitor from feeding power back into line PPC in the period between pulses.

Capacitor C3 supplies direct current through resistor R17 to zener diodes Z6 and Z7 in series which maintain line P10C at approximately 10 volts with respect to OV. Capacitor C4 helps to filter out any ripple in the P10C voltage. All of the integrated circuits on FIG. 7 obtain their power from P10C and OV, although this is not shown in FIG. 7.

The line P5 which connects zener diodes Z6 and Z7 is approximately 5 volts positive with respect to OV. It connects to one side of all of the loop windings L1 -L6. A positive reference voltage line PR is obtained by a voltage divider consisting of resistors R18 and R19; it is a fraction of a volt more positive than P5. Similarly a negative reference line NR is obtained by resistors R20 and R21. Line NR is a fraction of a volt more negative than line P5. Capacitors C5 and C6 filter out any ripple on these reference lines.

Comparators 19 -30 are used to detect pulses induced in the loops. The odd numbered comparators have their − input connected to line NR and their + input connected to the corresponding loop. This causes their outputs to have a low pulse whenever a negative pulse of sufficient magnitude is induced into the corresponding loop. The even numbered comparators have their − input connected to the corresponding loop and their + input connected to line PR. This causes their outputs to have a low pulse whenever a positive pulse of sufficient magnitude is induced in the corresponding loop. When no pulses are being induced in the loops, the outputs of all of the comparators are high.

NAND gate 31 has its three inputs connected to the outputs of comparators 19, 20 and 21 so that a pulse of either polarity in loop L6, or a negative pulse in loop L5 will, if of sufficient magnitude, cause the output of gate 31 to be high for the duration of the pulse. When the output of gate 31 goes high, it triggers monostable multivibrator 52 to cause its output to go low for about 2 microseconds. At the end of this pulse, when the output of 52 goes high, hex D flip-flop 53 is clocked so that the data appearing on its 6 inputs is set into the six outputs, to remain there after the loop pulses have disappeared, until the next positive transition of its clock input. The 2 microseconds of delay on the clocking of the hex D flip-flop 53 is to assure that the gates involved in decoding the loop pulses have had time to settle before a reading is taken.

Inverter 42 inverts the output of comparator 19 to supply the most significant digit of the decoding. Thus a negative pulse induced in loop L6 makes the output of inverter 42 high to signify a 0 in the decoded number.

Exclusive — OR gates 32, 34, 36, 38 and 40 are used to convert from Gray code to binary. Exclusive — OR gates 33, 35, 37, 39 and 41 are used to detect a lack of detectable pulse in any loop. NAND gates 43, 44, 45, 46 and 47 co-operate with these exclusive — OR gates to define the decoded binary numbers. The outputs of these NAND gates are low to denote a 1 and high to denote a 0.

The operation of this circuit can best be understood by first considering the case where all loops have detectable pulses induced in them. Then, exclusive — OR gates 33, 35, 37, 39 and 41 each have one input high and one input low; thus their outputs are all high. This makes one input high on NAND gates 43 - 47 so that they simply invert the outputs of exclusive — OR gates 32, 34, 36, 38 and 40.

If the output of comparator 19 is low, denoting a 1 for bit 6 of the Gray code, exclusive — OR gate 32 and NAND gate 43 act as an inverter to make the output of gate 43 opposite to the output of comparator 21. If the output of comparator 19 is high, denoting a 0 for bit 6 of the Gray code, exclusive — OR gate 32 and NAND gate 43 do not act as an inverter, and the output of gate 43 is the same as the output of comparator 21. Thus bit 5, as represented by the output of gate 43, is inverted if bit 6 is a 1, as required to agree with tables 1 and 2 in FIG. 6.

Similarly, if the output of gate 43 is low, denoting a 1 for bit 5 of the decoded number, exclusive — OR gate 34 and NAND gate 44 act as an inverter to make the output of gate 44 opposite to the output of comparator 23. If the output of gate 43 is high, denoting a 0 for bit 5 of the decoded number, exclusive — OR gate 34 and NAND gate 44 do not act as an inverter, and the output of gate 44 is the same as the output of comparator 23. Thus bit 4, as represented by the output of gate 44, is inverted if bit 5 of the binary number is 1, as required to agree with tables 1 and 2 in FIG. 6.

Similar circuits decode the remaining bits. If loop 6 does not have a detectable pulse induced in it, the output of comparator 19 is high, and the output of inverter 42 is low, indicating a 1 in bit 6 of the decoded binary number. This makes it appear as if the cell immediately below the central cell is energized when the car is situated such that the signal in loop 6 is indeterminate.

If any other single loop does not have a detectable pulse induced in it, the odd-numbered exclusive — OR associated with that loop has a low output and this forces the output of the corresponding NAND gate high to indicate a 0 in the corresponding bit of the decoded binary number. Inspection of FIG. 6 shows that this always makes it look as though the cell which is excited is the cell immediately below the cross-over which causes the loop pulse to be not detected.

This assures that although all the switching points on the loop stick are displaced slightly, the distance between adjacent switching points is maintained.

Although the pulses induced in the loops exist for only a short time, possibly 5 microseconds, after each deenergization of a pulse card, the hex D flip-flop 53 holds the information in its final decoded binary form. The six outputs of flip-flop 53 connect to seven of the eight channels of multiplexer 55. The most significant bit 6 connects to two of the inputs. The multiplexing order is from bottom to top on the symbol 55 in FIG. 7.

The first channel input is connected to OV so that the first digit of the multiplexed number is always 1. This is needed elsewhere in the circuits to give advance warning that a binary number is about to be transmitted. The second channel input is connected to the most significant output of flip-flop 53. This causes the second bit to be transmitted to be the sign bit; this is necessary to set up circuits elsewhere to correctly interpret the remaining bits of the transmission. The remaining six channels are connected in sequence, starting with the least significant bit, as required for sequential addition in other circuits.

While the line PPC has a positive voltage on it, the input to monostable multivibrator 51 is held high through resistors R16, R23 and R22. Diode D7 limits the voltage applied to resistor R23 to one diode drop higher than line P10C. The voltage divider consisting of resistors R22 and R23 limits the voltage on the input of MM51 to not more than P10C.

A counter 54 is used to drive the address inputs of the multiplexer 55. The clock input of counter 54 is obtained from the output of MM51 via gates 49 and 50. When the counter arrives at step 15, its CARRY-OUT output 54CO becomes low and this makes the output of gate 49 high regardless of the state of the output of MM51. Thus the counter waits at step 15 until the next pulse is detected in the loops, when the output of MM52 goes low for about 2 microseconds.

The de-energization of the coils on a pulse card is timed so that it occurs when the output of MM51 is high. The negative pulse on MM52 causes input 54C of clock 54 to go high to step the counter from its resting state 15 to its first state 0, and thus output 54CO goes high. The combination of 54CO high as well as the output of MM51 high causes the output of gate 49 to go low. This holds the output of gate 50 high after the end of the 2 microsecond pulse on the output of MM52, and the counter is once more locked into following the pulses on the output of MM51. It goes through the 14 intermediate states and then stops at step 15 again.

Thus, each time pulses are detected in the loops, the multiplexer 55 is addressed by the outputs of counter 54. For the second half of this operation, input 54E is high which disables the multiplexer and its output is internally disconnected so that resistor R27 applies the most significant digit to the input of inverter 56. At other times, the output of the multiplexer 55 forces the input of inverter 56 to assume the desired state.

The multiplexed signal train is inverted by inverter 56 and applied to one input of gate 48. During a transmission, when output 54CO is high, the output of gate 48 becomes low for the duration of the positive pulse on the output of MM51 but only if a 1 is being multiplexed. A low on the output of gate 48 turns off transistor Q3 via resistor R24 and this permits resistor R25 to turn on transistor Q4 via diode D8. This applies a short circuit to the lines PPC and OV. Initially, there is no voltage on these lines because this occurs at the end of a positive pulse on line PPC. However, when the equipment in the machine room, which applied pulsed power to line PPC, attempts to make PPC positive again, transistor Q4 prevents this until the timing terminates on MM51. The drive for lines PPC is current limited so that the current through transistor Q4 is limited to a suitable value.

FIG. 8A shows, by a solid line, the basic waveform on line PPC. The dotted lines show the alternative waveform which exists whenever 1 appears in the multiplexed signal. In other words, the voltage on line PPC normally attempts to rise along the black line; but can be held down for an extended time by transistor Q4 to signify a binary 1. The arrows in FIG. 8A show the approximate time at which the equipment in the machine room clocks the PPC line to determine, at each step of the sequential transmission, whether it is a 0 or a 1 which is being transmitted from the car.

FIG. 8B shows the order in which the bits are transmitted. If two pulse cards, for adjacent floors, are active on the loop stick, two successive transmissions occur, with a small gap between the two transmissions, since only 15 of the possible 16 bits are transmitted. This is because in the resting state (15) of counter 54, the output of gate 48 is held high so that transistor Q4 cannot short lines PPC and OV.

Figure 9B:
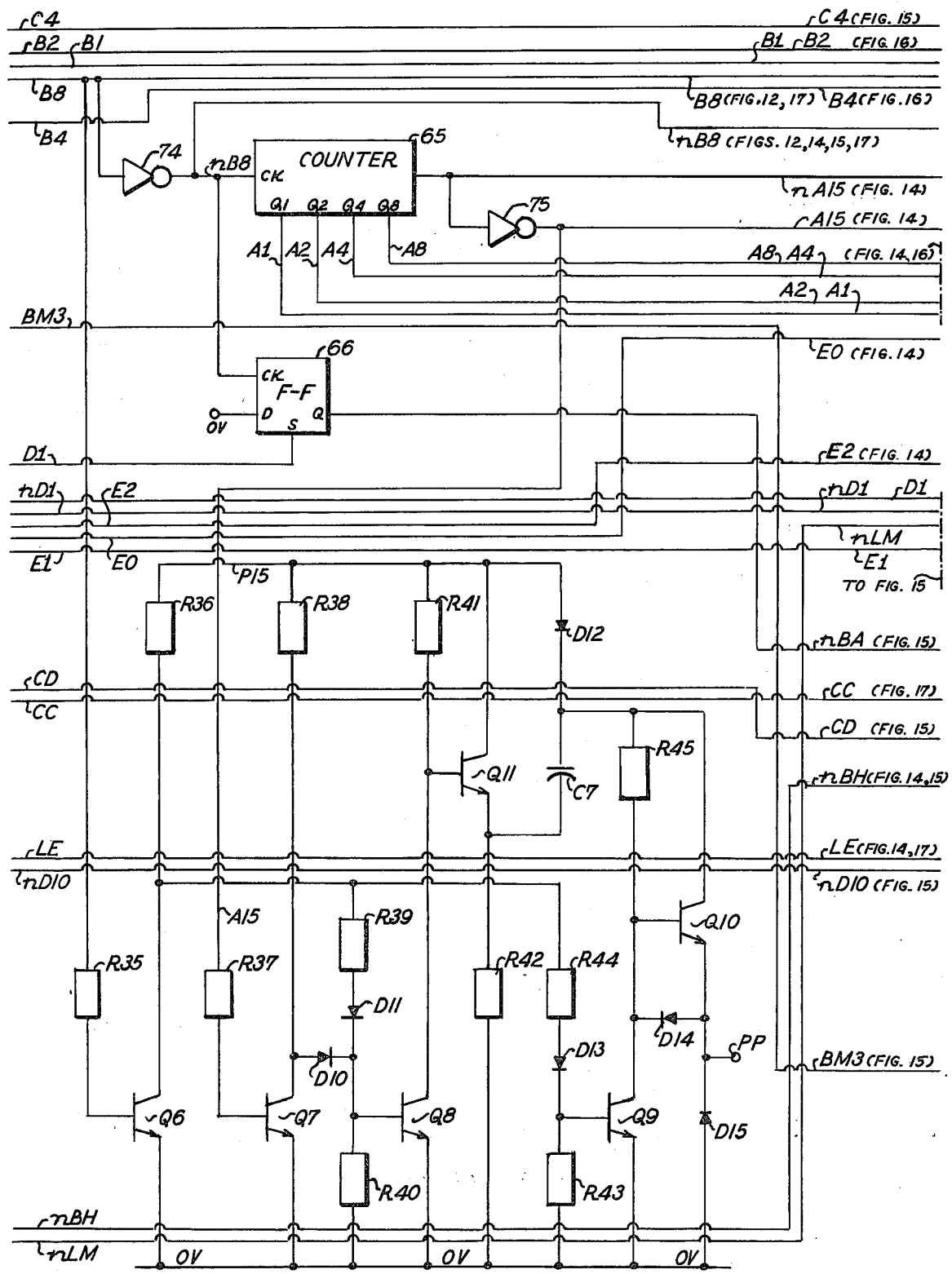

In FIG. 9, ASTABLE MULTIVIBRATOR 57 has timing components (not shown) of suitable values to act as the master clock for the system. Its output OSC is applied to 7-BIT BINARY COUNTER 58. The three least significant bits of this counter, called C1, C2 and C4 are processed by DECODER 61 and by CLOCKED FLIP-FLOPS 59 and 60 to produce useful clock signals CB, CC, CD, CE. The time relation of these repeating waveforms, along with signal CID which is required for creating CB, CC and CD, are shown in FIG. 10A. The frequency of AM57 is adjusted to get a suitable duration, such as 62.5 microseconds, for the period of those clock signals. This sequence of events, which repeats every 62.5 microseconds, will be referred to as the CLOCK SEQUENCE.

The four most significant bits of counter 58 are called B1, B2, B4 and B8 and are processed by decoders 62, 63, 64 and by gates 70, 71, 72 to produce further useful signals BL2, BL3, BM0, BM2, BM3, nBA, nD1, nD10, E0, E1 and E2. The time relationship of these signals is shown on FIG. 10B. Signal C4 is repeated in FIG. 10B to show the relationship. The total time for this cycle of events is 16 times the time required for the clock cycle. Thus, if the clock cycle takes 62.5 microseconds, the period for the signals shown on FIG. 10B is 16 times 62.5 microseconds, or 1 millisecond. This repeating sequence, shown on FIG. 10B, will be referred to as the BASIC SEQUENCE.

A further counter 65, preferably of type 4029, is provided to act as part of an address register whose purpose will be explained later. The clock input of counter 65 is obtained by inverting signal B8 with inverter 74 so that counter 65 steps to a new address each time B8 goes low. Counter 65 has 4 bits, and is arranged for binary counting so that it repeats its 16 states every 16 milliseconds. This repeating sequence of 16 steps will be referred to as the ADDRESS SEQUENCE. At step 15 (of 16 steps numbered 0 to 15) the CARRY-OUT output of counter 65 makes signal nA15 go low. Signal A15 is obtained by inventing signal nA15 with inverter 75.

The circuits so far described on FIG. 9 result in a repeating sequence consisting of 16 steps of ADDRESS SEQUENCE, with each such step lasting for an entire cycle of 16 steps of the BASIC SEQUENCE, and with each such step of the BASIC SEQUENCE lasting for one complete cycle of the CLOCK SEQUENCE.

The signal CE is of the correct frequency, phase and duration to control the pulses on line PPC. When signal CE is high, transistor Q12 is turned on by resistor R28, and this causes resistor R30 to turn off transistor Q13. The line PPC is then pulled up to a positive valve close to the plus 24 volt D.C. supply line P24 by resistor R31 unless the transistor Q4 on FIG. 7 is turned on. When signal CE is low, transistor Q12 is turned off and this permits current to flow through resistor R29 and diode D9 into the base of transistor Q13 to turn it on. This pulls the PPC line down close to zero voltage with respect to OV, and current limiting resistor R31 has nearly the full 24 volts applied to it.

Thus, the line PPC is caused to have the waveform shown on FIG. 8A and described earlier. A circuit consisting of resistors R32, R33, R34, zener diode Z8 and transistor Q5 is used to attenuate and invert the PPC signal for use by CLOCKED FLIP-FLOP 68.

The purpose of zener diode Z8 is to assure that the switching threshold of transistor Q5 is approximately half way between the two levels of voltage on line PPC, for best rejection of electrical noise on the PPC line.

FLIP-FLOP 68 is clocked by signal CB which goes high at a suitable time, as indicated by the arrows on FIG. 8A, for reading the condition of line PPC. Thus, the condition of line PPC at the instant when CB goes from low to high is retained until the next time CB goes from low to high. The outputs of FF68 are called LM and nLM, for LOOP MULTIPLEXING because they contain, in normal and inverted form respectively, the multiplexed train of pulses from the car.

Special clock pulses E0 and E1 are used as clock inputs for CLOCKED FLIP-FLOPS 67 and 69, respectively, which use signal LM as a data input. These special clock pulses are high when signal CC is high, for the first and second steps respectively of the 15 step transmission from the car. During the first of these steps, a 1 is transmitted if the loops have been excited, and thus signal LE, from FF 67 is high whenever the loops have been excited in the loop stick; LE then remains high for the period of one complete BASIC SEQUENCE at which time it goes low or remains high if a further loop excitation occurs immediately, as with two adjacent pulse cards active on the loop stick.

During the second step of a transmission from the car on line PPC, the information transmitted is bit 6 which indicates whether it is the upper or lower half of the loop stick which has pulses induced in it. Thus output nBH of FF69 is low if the bottom half of the stick is energized. Output nBH is high if it is the upper half or the central cell which is energized.

Signal B8 has the correct frequency, phase, and duration for controlling the pulses on line PP which supplies the pulse cards with pulsed power. When B8 is high, transistor Q6 is turned on via resistor R35. This causes resistor R43 to turn transistor Q9 off. Current then flows from the plus 15 volt D.C. supply line P15 through diode D12, resistor R45 and the base of transistor Q10 which acts as an emitter-follower to pull line PP up close to supply line P15. Because of voltage drops in diode D12 and transistor Q10, the actual voltage on line PP might be about 12 or 13 volts.

When signal B8 is low, transistor Q6 is turned off, and transistor Q9 is turned on by the flow of current through resistors R36 and R44, diode D13 and the base of Q9. This pulls the base of transistor Q10 down to nearly zero voltage with respect to OV and causes line PP to have essentially zero voltage on it. Diode D14 assists in pulling line PP down in spite of any tendency of positive spikes to be induced in the wires in the hoistway. Diode D15 provides a path for discharging the inductive current from the hoistway wires.

The preceeding descriptions of the control of line PP under the command of signal B8 has been on the assumption that signal A15 is low. Whn A15 is low, transistor Q7 is turned off, and current flows from line P15 through resistor R38 and diode D10 into the base of transistor Q8 causing it to turn on. This causes the base of transistor Q11 to be made negative with respect to its emitter so that it turns off. This causes capacitor C7 to charge through diode D12 and resistor R42.

When A15 goes high, at step 15 of the ADDRESS SEQUENCE, transistor Q7 is turned on via resistor R37. However, at the same instant signal B8 goes low and turns off transistor Q6. A new path from line P15 through resistors R36 and R39 and Diode D11 replaces the previous path through resistor R38 and Diode D10 to maintain transistor Q8 turned on.

During the second half of the duration of A15 in the high state, signal B8 goes high, and then the turning on of transistor Q6 stops the flow of current through resistor R39 and diode D11 and thus transistor Q8 turns off. Transistor Q11, acting as an emitter follower, has its base pulled up by resistor R41 so that its emitter raises the negative terminal of capacitor C7 up to near the voltage of line P15. Since the capacitor was previously charged to approximately 14 volts, the positive terminal of capacitor C7 rises to approximately double the usual voltage on line PP and since transistor Q10 is turned on at the same instant as a result of B8 going high, line PP receives a positive pulse of roughly twice the normal value. The capacitor C7 quickly discharges, however, so that the voltage on line PP reverts exponentially to the normal value. This produces the waveform shown in FIG. 3; each time signal A15 goes high, a pulse of double height is momentarily applied to line PP for the purpose of synchronizing the counter in each pulse card.

Figure 11A:
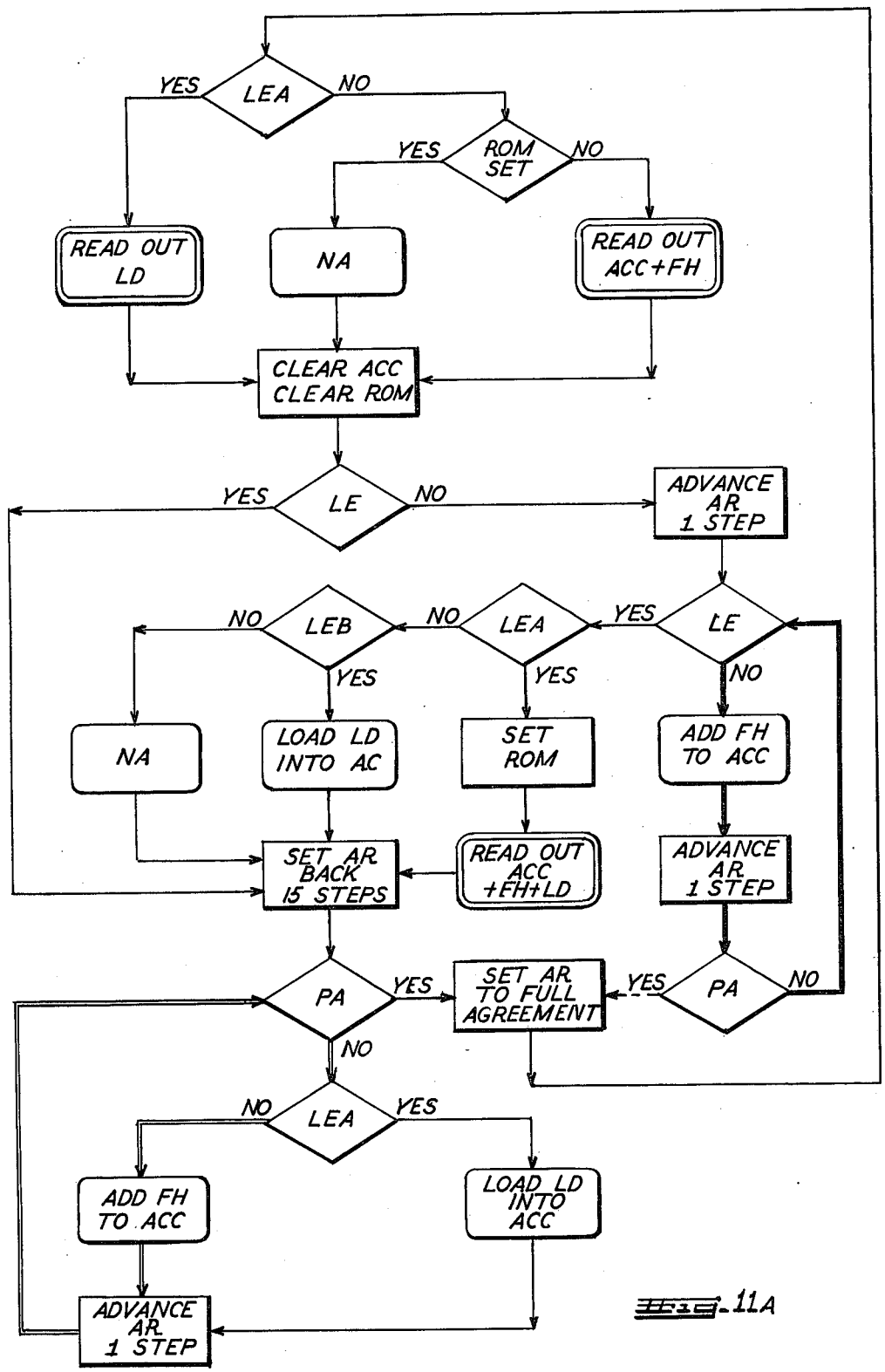
FIG. 11A is a flow chart of a computing program for calculating the target distance.

FIG. 11 shows a computing procedure which could be used to calculate the target distance. The 16 step sequential operation refers to the BASIC SEQUENCE described earlier. The address register AR would consist of the counter 65 on FIG. 9 plus whatever additional binary bits are required to get a unique address for each pulse card in the hoistway.

The heavy lines connecting some of the blocks in FIG. 11 represent a repeating sequence which occurs before a loop excitation had been detected. The double lines connecting some of the blocks in FIG. 11 represent a repeating sequence which occurs after a loop excitation has been detected. The dotted line represents a path which is used when there are no loops excited. This is the situation which would exist if the car were in an area of the hoistway where there are no pulse cards, such as an express zone.

The double lines around some of the blocks on FIG. 11 represent a final read-out of the computed target distance. There are three such blocks, because three types of read-out are possible. The simplest read-out occurs when the loops happen to be excited by the pulse card at the target floor. Then, the loop distance is read out directly.

If the target floor is below the car, but not over 16 floors away, the read-out is achieved by adding the contents of the accumulator (which has been adding up the intervening floor heights), the present floor height, and the stick distance.

Otherwise, the target distance is read out by adding the contents of the accumulator to the present floor height. The accumulator in this case has already added the last loop distance and the intervening floor heights.

FIG. 11 is included to show how a micro-processor might be programmed to calculate the target distance. The remaining figures show a circuit for doing the calculation in "hard-wired" form rather than with "soft-ware."

Figure 12A:
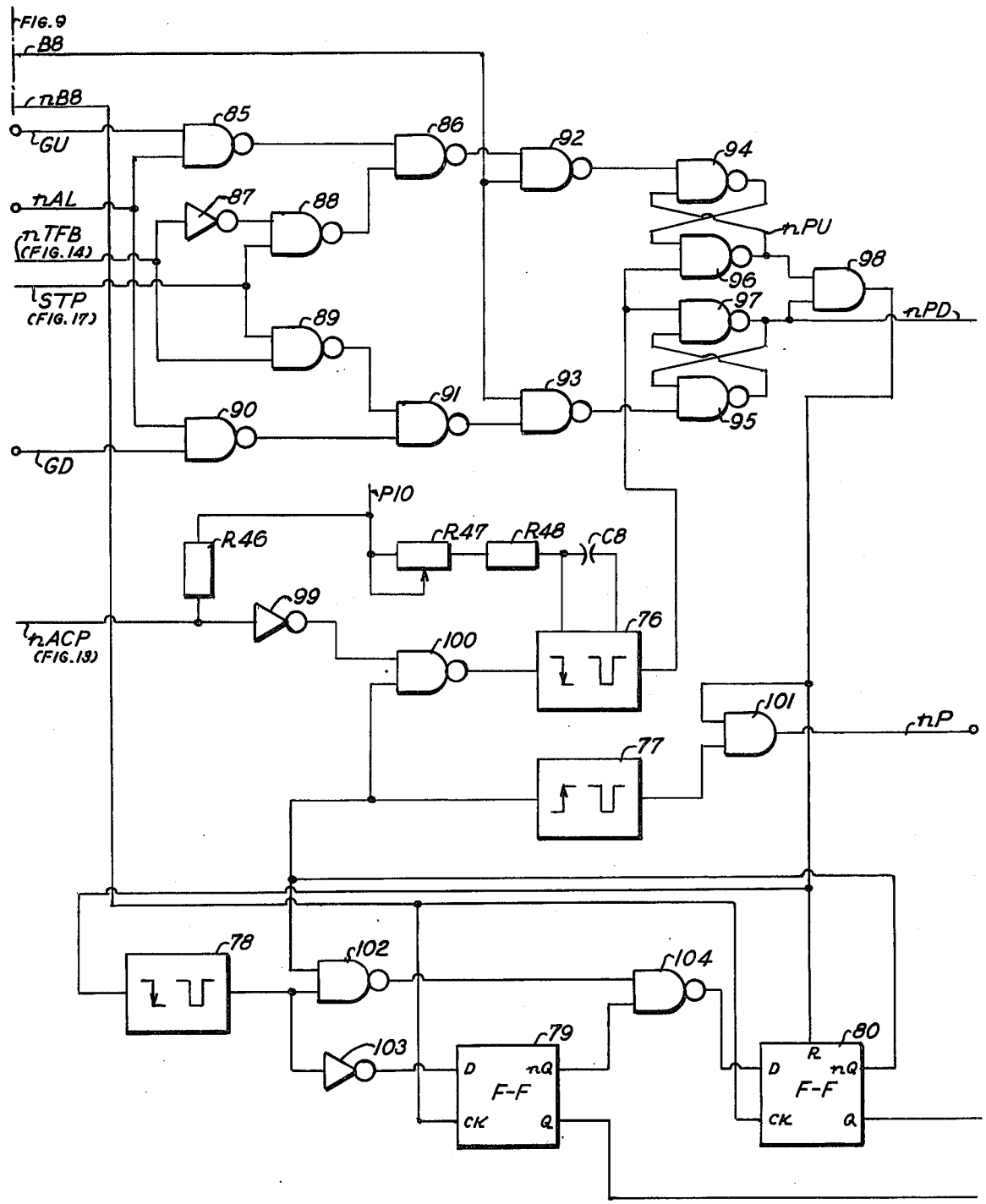
FIGS. 12A and 12B show a circuit for defining the target floor as a binary number, and for decoding this binary number into two-digit octal form.
Figure 12B:
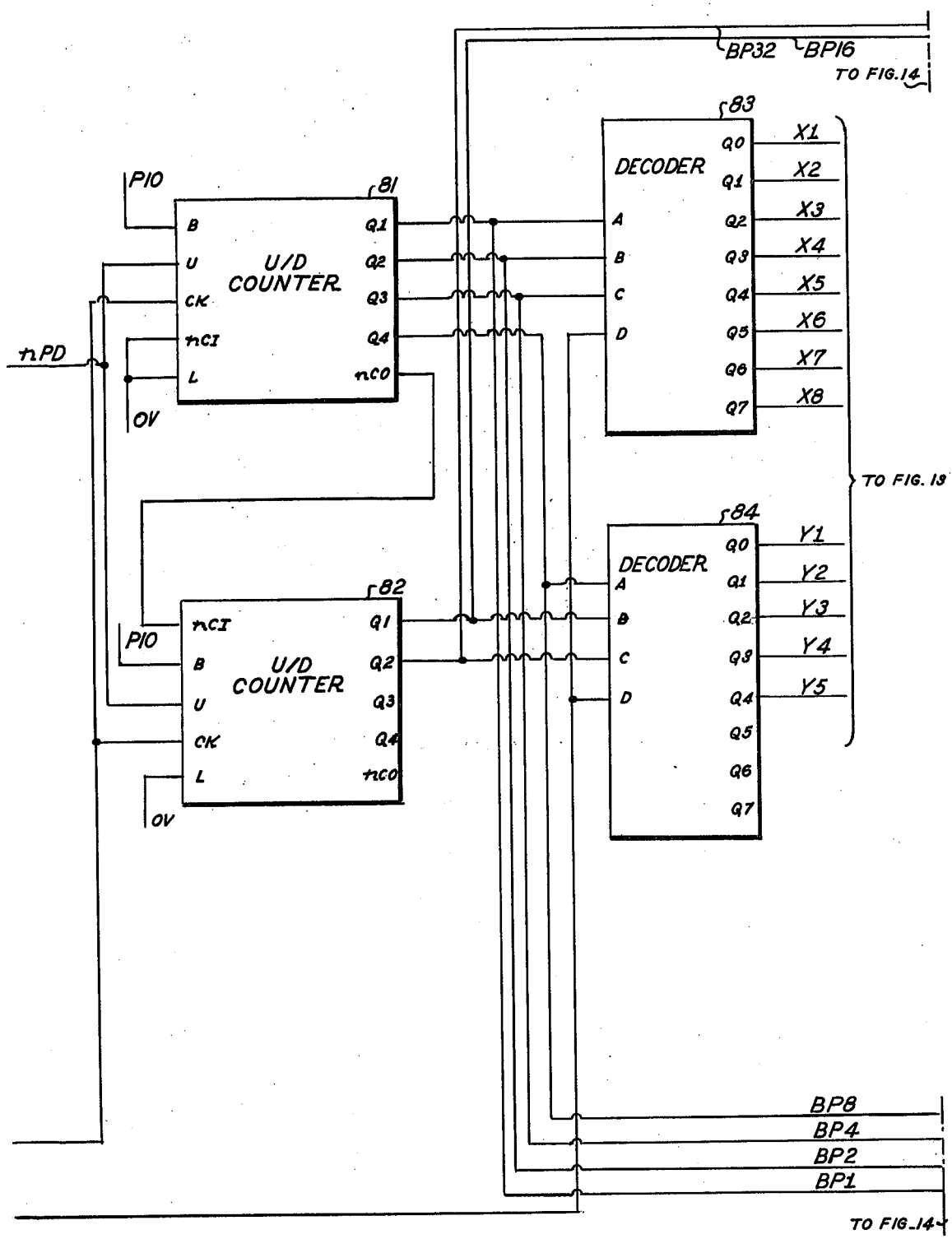

FIG. 12 contains a circuit for identifying the target floor. Two 4-bit up/down binary counters 81 and 82 are used to specify the target floor. All four bits of counter 81 are used. This counter alone would suffice for 16 pulse cards or less.

Counter 82 has been shown on FIG. 12 with two of its 4 bits used. This would basically permit up to 64 pulse cards. For up to 32 pulse cards, only one bit of counter 82 need be used.

The three least significant binary outputs of counter 81 are decoded into octal form by DECODER 83, of type 4028. Although this type of decoder is basically for decoding BCD (binary coded decimal) inputs, it works equally well for 3 bit binary decoding. The extra input D, when high, makes all outputs low except Q8 and Q9 which are not used.

The most significant output of counter 81 and the two outputs of counter 82 are similarly decoded into octal form by DECODER 84, of which only 5 outputs are used. This gives a maximum of 40 pulse cards.

Thus, for any state of counters 81 and 82, there is a corresponding condition for the octal outputs of decoders 83 and 84. In each case, only one output of each decoder is high.

The nCO output (CARRY-OUT) of counter 81 is connected to the nCI input (CARRY-IN) of counter 82 so that they together act as a single 6-bit counter.

The binary outputs of counters 81 and 82 are also required for other parts of this circuit, and are named BP1, BP2, BP4, BP8, BP16, and BP32 in accordance with their binary weights expressed in decimal form.

A flip-flop consisting of gates 94 and 96 is used for stepping the counters up to a higher number. A flip-flop consisting of gates 95 and 97 is used for stepping the counters down to a lower number. Output nPD of this latter flip-flop is used to drive the U inputs of the counters to cause them to step up or down as required.

The setting of either of these flip-flops is clocked by signal B8 and can occur for either one of two reasons. For normal stepping of the target floor, input GU or GD is switched high by other circuits which are not a part of this patent. Generally, input GU for up or input GD for down must be made high at the instant the car starts to run, and held high until the target floor has arrived at a floor where a stop is required. For bringing the target floor into agreement with the car's position, such as after a power failure, input STP is made high by circuits on FIG. 17 and input nTFB, which will be described later, determines the direction.

Once either of these flip-flops is set, a sequence of events is initiated by the output of gate 98 going low. This triggers MM78 so that a negative pulse occurs on its output, and a positive pulse occurs on the output of inverter 103. The duration of this pulse might be of the order of 40 to 50 milliseconds.

Shortly after the preceeding events are triggered by B8 being high, B8 goes low and its inverted signal nB8 goes high. This low to high transition on the CK (CLOCK) input of flip-flop 79 in combination with a high signal on its D (DATA) input causes its output nQ to go low. The Q output going high causes the D inputs of decoders 83 and 84 to go high and this makes all of the octal outputs go low. The reason for this will be apparent later.

At the next low to high transistion of signal nB8, flip-flop 80 alters the state of its outputs because the low nQ output of flip-flop 79 now makes the output of gate 104 high. Thus output Q of flip-flop 80 goes high and thereby causes the counter to advance one step in the desired direction, and also the nQ output of flip-flop 80 goes low.

When the output pulse on MM 78 ends, the output of inverter 103 becomes low again and at the next low-to-high transition of signal nB8, the Q output of flip-flop 79 becomes low again and the outputs of the decoders now assume the correct states to specify the new state of the counter, which has advanced one step from the previous state. At the next low-to-high transition of signal nB8, the outputs of flip-flop 80 also return to the original condition.

This triggers MM 77 which then produces a negative pulse at its output, with a duration of approximately 40 to 50 milliseconds. Normally, MM 76 gets triggered at the same time and its output goes low for a period of time which can be adjusted by variable resistor R47. When the output of MM 76 goes low, the two flip-flops 94 and 96, and 95 and 97 are held in the reset condition so that no further stepping can occur until the timing has elapsed on MM 76.

An output nP is provided which goes low at the beginning of a target floor advance sequence, and remains low until MM 77 finishes its timing. This output can be used to indicate to other equipment that the target floor is in the process of being advanced. During this time, no cancelling of calls or illumination of hall lanterns should occur.

FIG. 13 shows a circuit which is required for each floor served. It is convenient to assume that there is a small card, called a floor card, for each floor and that each floor card contains the circuit shown in FIG. 13.

Each floor card has its inputs XX and YX connected in a different way to the outputs of decoders 83 and 84. Input XX must connect to the appropriate one of outputs X1, X2, X3, X4, X5, X6, X7 or X8. Similarly, input YX must connect to the appropriate one of outputs Y1, Y2, Y3, Y4 or Y5.

When the target floor, as identified by counters 81 and 82, agrees with a particular floor card, both of its inputs XX and YX are high. All other floor cards should not have these inputs both high. When they are both high, the output of gate 105 becomes low, and this is amplified by amplifier 106 in order to drive a relay or other electronic circuits. For example, this might be a relay for each floor served, with contacts for energizing hall lanterns and position indicator lamps. Only one such relay would be energized at a time.

The nACP outputs of all the floor cards are connected together to feed into the nACP input of inverter 99 in FIG. 12. Generally, nACP is held low by the floor card for the target floor. However, if the counter steps to a state for which there is no corresponding floor card, signal nACP is pulled up by resistor R46 in FIG. 12, to make the output of inverter 99 low. This prevents the triggering of MM 76 and thereby holds signal nPU or nPD low. This causes flip-flop 80 to toggle back and forth between its two states, in order to step the counters, until the target floor arrives at a floor where there is a floor card.

This is the mechanism whereby the target floor automatically passes over "dummy" floors which have no entrances, but require pulse cards in order to locate the car. It is inherent in these circuits that a separate binary number be reserved for each pulse card, even if there is no corresponding entrance.

The reason for making all of the decoder outputs low, during the first 40 or 50 milliseconds of the target floor advance sequence, is to assure that there is no overlap in the relays driven by the floor cards. If the new relay were to close its normally open contacts before the previous relay had dropped out, difficulties could be encountered in the peripheral circuits.

The timing of MM 76 can be adjusted to control the maximum rate at which the target floor can advance. If the rate is too slow, the car will start to slow down at the target floor before it steps on ahead to a new floor. However, if the timing is too short, the target floor may advance too quickly as the car accelerates and thus bypass floors where late-registered calls might have otherwise been answered. Once the target floor had advanced to a new floor, the peripheral circuits cannot cause a stop at the old target floor, even if the car is far enough away to make a proper stop.

Input nAL must be controlled by suitable logic, which will be disclosed in a copending patent so that when the target distance has exceeded the slowdown distance, nAL goes low to stop further advance of the target floor. At top speed, each time the target distance decreases to a value slightly greater than the slowdown distance, nAL goes high briefly to cause the target floor to advance one step.

Figure 14A:
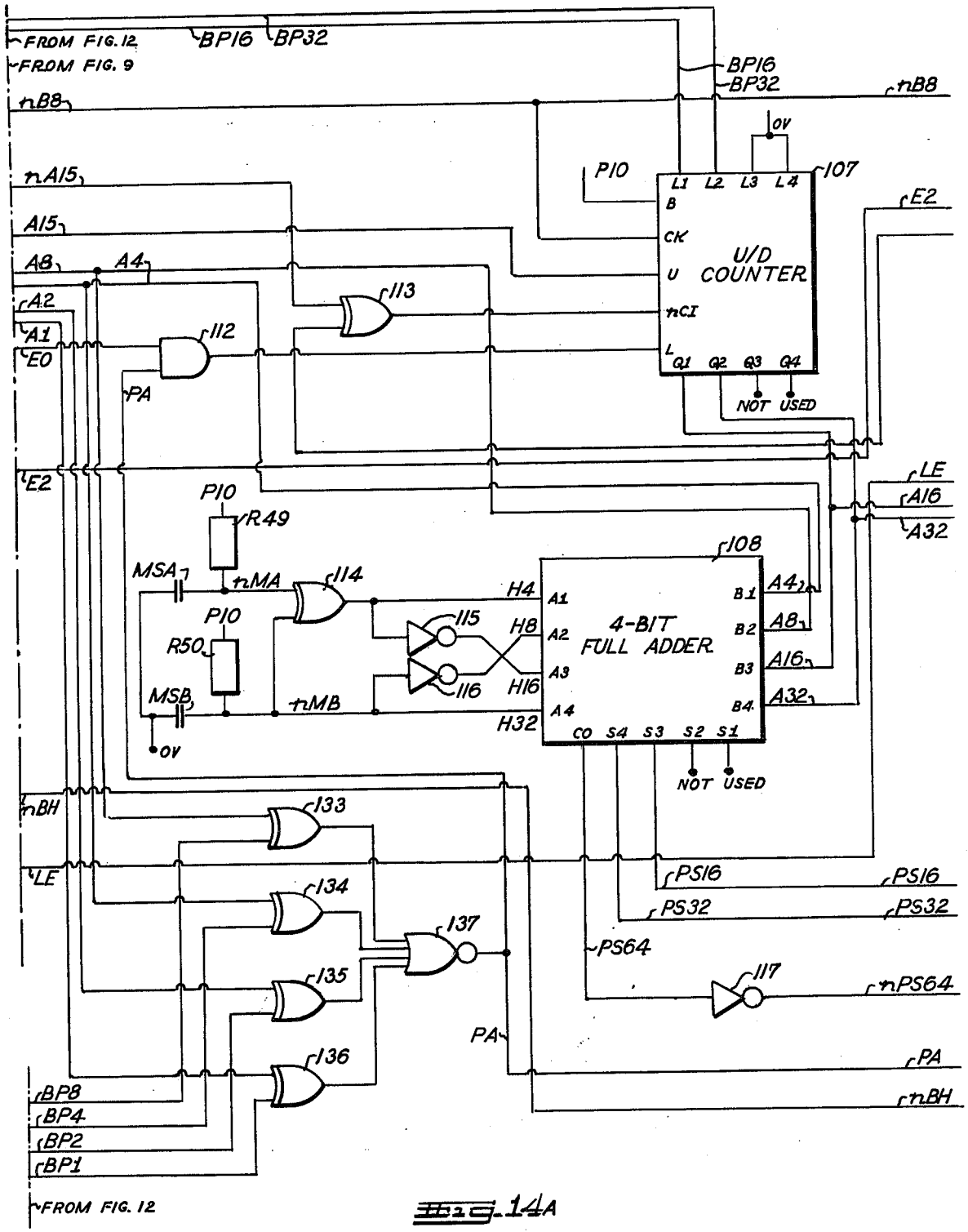
FIGS. 14A and 14B show the preliminary part of the circuit for calculating the target distance.
Figure 14B:
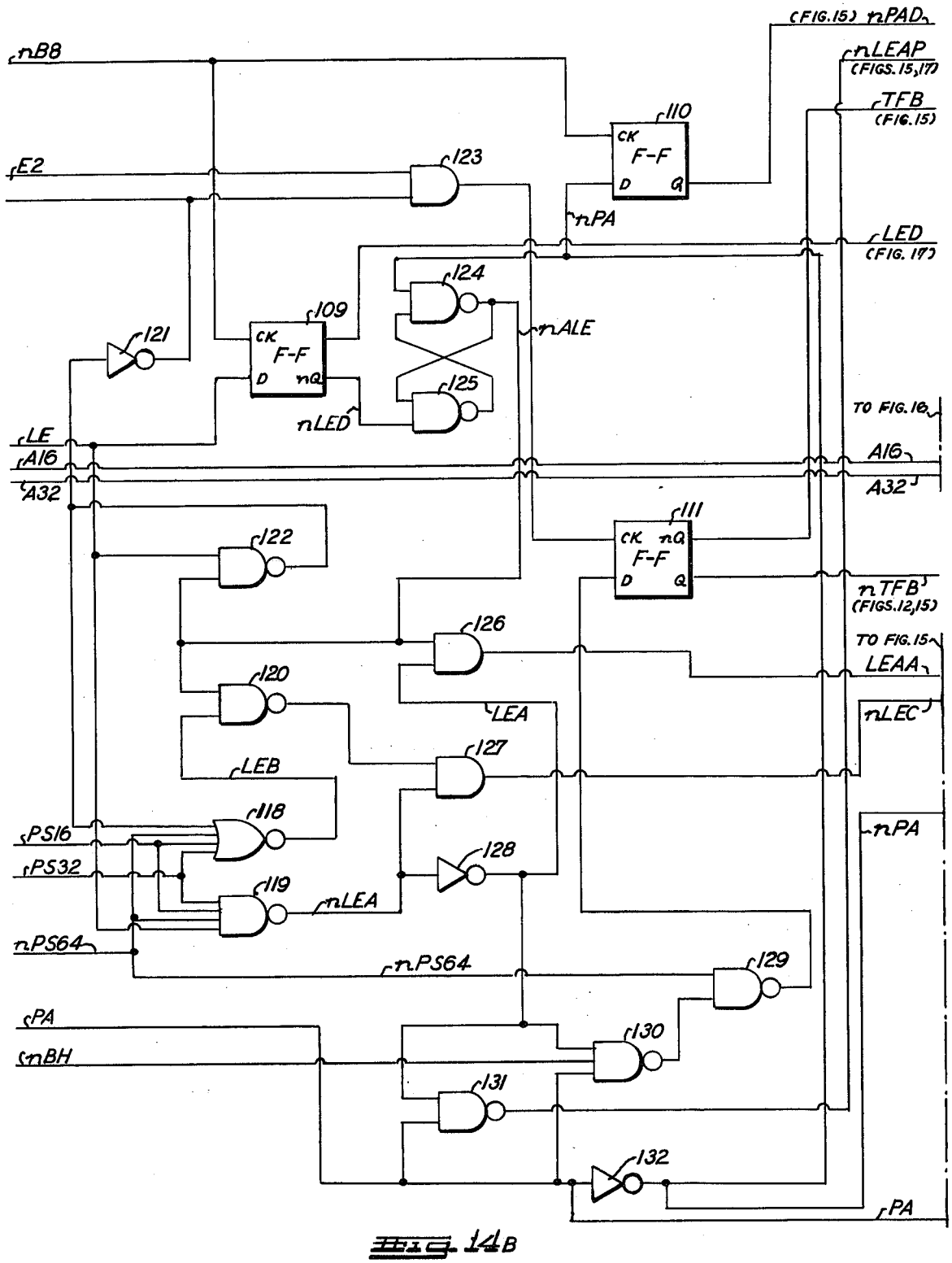

In FIG. 14, EXCLUSIVE—OR gates 133, 134, 135 and 136 are used to compare the four least significant bits of the target floor binary number, (BP1, BP2, BP4 and BP8) with the four least significant bits of the address register (A1, A2, A4 and A8). If these two binary numbers agree, the outputs of the four EXCLUSIVE-OR gates are all low, and thus the output of NOR gate 137 is high. This signal is given the name PA to indicate partial agreement as defined in FIG. 11.

When partial agreement is detected, clock pulse EO going high causes the output of gate 112 to go high and this causes counter 107 to be loaded to a condition determined by inputs BP16 and BP32 which are the most significant bits of the target floor binary number.

Counter 107 is used to identify the two most significant digits of the address register. Generally, counter 107 does not step when signal nB8 goes from low to high because its nCI input is high. However, when the counter 65 on FIG. 9 is at step 15, nA15 is low to make the output of EXCLUSIVE—OR 113 low and the counter 107 does step one step, and since A15 is high, it steps up. So far, the counter 107 acts as an extension of the counter 65 on FIG. 9 and thus completes the address register.

However, as indicated on FIG. 11, it is necessary sometimes to step the address register back 15 steps. This is done by allowing the counter 65 on FIG. 9 to count up one step while causing the counter 107 to count down one step which, because of the greater significance of its digits, is equivalent to jumping back 16 steps. The combination of 16 steps back, and one step forward, achieves the desired result of 15 steps backward.

Gate 122 controls this backward stepping of the address register; when its output is low, the output of inverter 121 is high and this makes the output of EXCLUSIVE—OR 113 low to cause counter 107 to step when signal nB8 goes from low to high. Signal A15 is assumed to be low to cause the counter to step down.

However, if the output of gate 122 is low at the same time that nA15 is low, the output of EXCLUSIVE—OR 113 is high to prevent counter 107 from stepping. The result is still equivalent to jumping back 15 steps since the failure of counter 107 to advance, when a carry operation from counter 65 is required, is equivalent to going back 16 steps.

Examination of FIG. 11 shows that the address register must be set back 15 steps each time the first loop excitation is detected, but not until after the BASIC SEQUENCE is finished, and no further setting back of AR should occur until after the next partial agreement. The circuit for accomplishing this consists of CLOCKED FLIP-FLOP 109 and gates 124, 125 and 122. The output LED of flip-flop 109 is delayed by exactly one BASIC CYCLE from signal LE. The flip-flop consisting of gates 124 and 125 is set by signal nLED going low, which makes nALE low. The resetting occurs when nPA goes low during partial agreement. Thus, it is only the first time LE goes high that the output of gate 122 goes low to cause the address register to jump back 15 steps.

In FIG. 11 it is necessary to determine, during a loop excitation, whether the pusle card which causes the excitation is in agreement with the address register, or whether it is out of agreement. If it is out of agreement, it must be out by 16 floors, or a multiple of 16 floors because of the way in which the pulse cards are programmed. In particular, it is necessary to know when the loops are excited by a pulse card which is 16 floors below the address register.

The circuit for doing this consists of a 4-BIT FULL ADDER 108, EXCLUSIVE—OR 114, inverters 115, 116 and 117, and gates 118 and 119. The FULL ADDER 108 determines the sum of the four most significant bits A4, A8, A16 and A32 of the address register and four special bits H4, H8, H16 and H32. These four special bits are controlled by hoistway memory switches MSA and MSB, which could be magnetically or mechanically actuated.

When the car is in the lower part of the hoistway, so that any energization of the loops can only be caused by one of the lowest 16 pulse cards, magnetic memory switches MSA and MSB are both open. Resistors R49 and R50 then hold signals nMA and nMB high. This makes signals H16 and H32 high. This is equivalent to presenting decimal number 48 to the "A" inputs of adder 108. Thus, any address on the address register, between 0 and 15 will result in a sum of between 48 and 63. For any such sum, the CARRY-OUT output CO of the adder 108 is low, and also the S3 and S4 outputs, which are named PS16 and PS32 respectively in accordance with their binary weight, are high. The carry-out of adder 108 is similarly called PS64 for its binary weight expressed in decimal form.

Thus, for the car in the lower part of the hoistway and the address register between 0 and 15, as described in the preceeding paragraph, whenever signal LE goes high the output of gate 119 goes low, to make signal nLEA low and signal LEA high. This corresponds with the LEA condition as described in FIG. 11.

However, with the car situated as in the previous two paragraphs, but with the address register between 16 and 31, the sum will be between 64 and 79. In this range, signals nPS64, PS32 and PS16 are all low, and if the output of gate 122 is also low, due to LE being high, the output LEB will be high to indicate condition LEB as defined on FIG. 11.

Further examination of this circuit involving adder 108 will show that for any address above 32 neither LEA nor LEB is high.

Memory switch MSA is arranged to be closed when the car is above a particular position in the hoistway; this position is slightly below the point where the loop sticks can be energized by the PC17 pusle card. Memory switch MSB is similarly arranged to be closed when the car is above another higher point in the hoistway; this additional point is slightly below the point where the loop sticks can be energized by the PC29 pulse card. If there are more than 40 floors, memory switch MSA must also be arranged to be open when the car is in the upper part of the hoistway, where pulse cards PC41 to PC52 can excite the loop stick. The maximum number of floors is 52 with the circuit shown in FIG. 14, but the same principle could be used to extend this to a greater number of floors.

Thus, if memory switch MSA is closed, and memory switch MSB is open, the car is situated on the hoistway such that the loop stick can be excited by pulse cards PC16 to PC28, and also (depending on floor heights) by pulse cards PC15 and possibly PC14. With this condition of the memory switches signals H4 and H32 are high and this is equivalent to applying decimal number 36 to the "A" inputs of adder 108. Now, any address between 0 and 11 results in a sum between 36 and 47. This makes either PS16 high or PS32 high, but not both and thus neither LEA nor LEB can be high.

It is only when the address register is between 12 and 27 that the sum is between 48 and 63; such as sum makes LEA high. Similarly any address between 28 and 39 makes the sum between 64 and 75 which results in LEB being high.

Similar examination of the remaining two portions of the hoistway, as defined by the memory switches MSA and MSB, reveals that in all cases, signals LEA and LEB go high to detect conditions LEA and LEB on FIG. 11.

Certain other useful signals are derived from LEA and LEB on FIG. 14.

Signal LEAA is created by gate 126; it goes high only during the first time condition LEA is detected, not during any subsequent LEA conditions prior to partial agreement.

Signal nLEAP is created by gate 131; it goes low when condition LEA coincides with partial agreement.

Signal nLEC is created by gate 127; it goes low when condition LEA is detected and also when condition LEB is first detected, but not for subsequent LEB conditions prior to partial agreement.

It is important to know whether the target floor is above or below the car. A CLOCKED FLIP-FLOP 111 is used for this purpose. It is clocked by gate 123 during the special E2 clock pulse at the first loop excitation. If this loop excitation happens to coincide with the address register, signals PA and LEA are high, and thus signal nBH, is gated through gates 130 and 129 to the data input of flip-flop 111. Otherwise, the nPS64 signal contains the desired information and controls the output of gate 129. The result is that signal TFB is high when the target floor is below the car. Signal TFB is low when the car is level at the target floor, or when the target floor is above the car.

Signal nPAD is delayed by CLOCKED FLIP-FLOP 110 in a similar manner to signal LED. Thus nPAD is low for the entire BASIC CYCLE which occurs immediately after partial agreement.

Figure 15B:
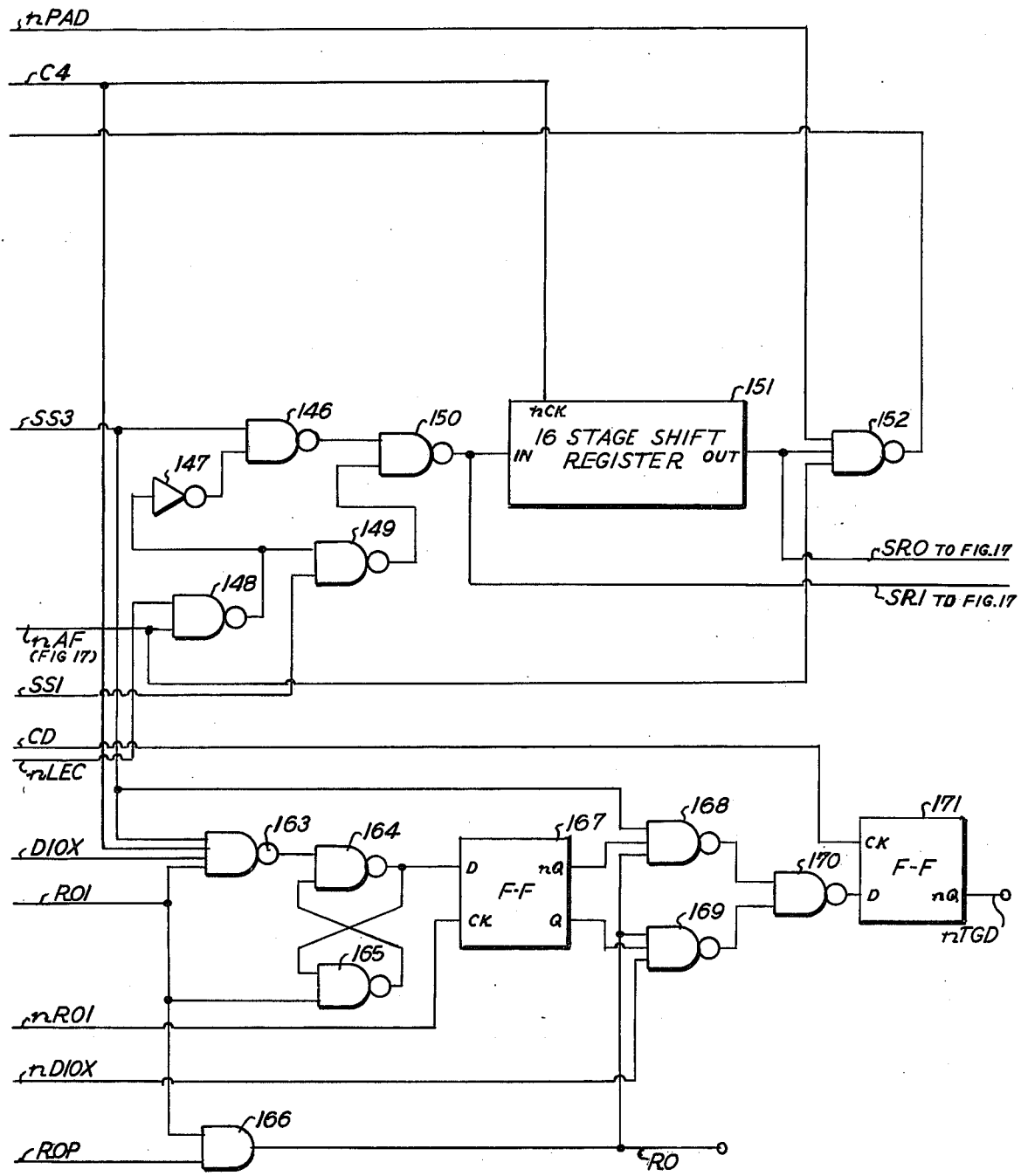

In FIG. 15, a 16-stage shift register 151 is used as the accumulator mentioned on FIG. 11. It operates in conjunction with two parts 141B and 141C of the triple serial adder 141.

The loop distance, as defined on FIG. 11, is available in serial form on signal nLM. This is entered into one input of one adder 141A of triple serial adder 141. Generally, input nAF is high; this purpose will be described in connection with FIG. 17. With nAF high, signal TFB is gated through gates 199 and 202 to control the inverting input nI of adder 141A. This causes the sum output nS of adder 141A to be inverted when the target floor is above, and not inverted when the target floor is below. This is necessary to make the loop distance have the correct polarity for adding to or subtracting from the floor heights.

Because of the 2's complement system of negative binary numbers, and also because of the small central cell in the loop stick with a 2-inch cell immediately above and below, it is necessary to further process the first (least significant) bit of the loop distance. The logic for doing this is contained in gates 138, 139 and 140. Basically, when the first bit is being transmitted, nD1 is low and D1 is high so that signal nBH determines whether to add binary 1 to the serial number on signal nLM to compensate for the 2's complement error as well as the central stick cell error. The result is that the central cell is included in either of the adjacent 2-inch cells for loop distance processing purposes, so as to not falsely count the 1-inch cell as a 2½-inch cell.

The nS output of adder 141A represents the loop distance expressed as a binary number, but it differs from signal nLM by being always of the correct polarity to suit the calculation of the target distance. Gate 144 uses signal nBA to modify the nS output of adder 141A so that its output SS1 is low for the first two steps of the BASIC SEQUENCE, and thereafter represents the loop distance. The condition of signal nLM is not pertinent to the loop distance while nBA is low.

A floor height memory circuit, which will be described in connection with FIG. 16, continually presents, on signal FH1, a sequential binary number which indicates the distance between the floor presently being addressed, and the floor immediately below it.

This is processed by gate 143 to assure that the processed output nFH can only go low for the six pertinent steps of the BASIC SEQUENCE.

Generally, the serial adder 141B continually adds the serial floor height, as expressed by the signal nFH, to the serial output of the accumulator which is gated through gate 152. This serial sum is the signal SS2 and it is normally gated through gate 142 and applied to one input of serial adder 141C. If no loops are excited, signal SS1 is continuously low, the output of gate 145 is high and th output SS3 of serial adder 141C is identical with SS2. The SS3 signal is then normally gated through gates 146 and 150 and into the input of shift register 151 which acts as the accumulator. Thus, in this mode of operation, the contents of the accumulator are being increased during each BASIC SEQUENCE by the amount of the appropriate floor heights. This achieves the two routes shown on FIG. 11 by solid lines and by double lines.

The clearing of the accumulator, which is shown on FIG. 11 as an instantaneous action, is accomplished in a somewhat different manner on FIG. 15. The clearing of the accumulator must always occur after the detection of partial agreement, and thus signal $n$PAD is applied to one input of gate 152. This causes the output of the shift register to be ignored by serial adder 141B and this interruption of the calculating route is sufficient to cause a fresh start on the next BASIC SEQUENCE.

On FIG. 11 there are two places where it is necessary to load the loop distance into the accumulator. This is done by signal $n$LEC which makes the output of inverter 147 low to stop the SS3 signal from entering the shift register, and also it makes the output of gate 148 high to cause gates 149 and 150 to convey the SS1 signal into the shift register.

The read-out memory ROM mentioned on FIG. 11 consists of CLOCKED FLIP-FLOP 154 on FIG. 15. It is set by gate 153, and is reset at the end of partial agreement when signal $n$PA goes high. The condition of this flip-flop determines whether a read-out operation occurs during partial agreement. If it is not set, its output $n$Q is high, and when signal PA is high, the output of gate 156 goes low to make signal $n$RO1 low via gate 157. If this flip-flop is set, its output Q is high, and then when signal LEAA is high, during the first LEA period, the output of gate 155 makes $n$RO1 low via gate 157.

During a read-out operation, the signal SS3 contains the final computed target distance as a sequential binary number. If this read-out occurs during PA and LEA, signal $n$LEAP is low to prevent adder 141C from adding in the contents of the accumulator, and also signal LEAA is high to cause gate 145 to enter the loop distance directly into the other input of adder 141C so that it emerges on signal SS3. This is in accordance with the read-out box at the upper left part of FIG. 11.

If the read-out operation occurs during PA, but not LEA, signal $n$LEAP is high, signal LEAA is low, and thus the quantity which is read out is the sum of the contents of the accumulator and the pertinent floor height. This is in agreement with the read-out box at the upper right part of FIG. 11.

If the read-out operation occurs during LEA, but not PA, signal $n$LEAP is high and also signal LEAA is high and thus the quantity which is read out is the sum of the contents of the accumulator, the pertinent floor height, and the loop distance. This is in accordance with the read-out block in the lower middle part of FIG. 11.

A circuit consisting of flip-flop 167 and gates 163, 164, 165, 168, 169 and 170 can be used, if desired, to detect an overflow of the target distance, and transmit the maximum value instead of the false value which would result from transmission of less than the full number of bits.

In the circuit of FIG. 15, only 10 bits are transmitted for expressing the target distance, and of these 10 bits, the most significant bit is actually a sign bit; this is because of the type of circuit anticipated for the translation of target distnce into velocity pattern which will be described in a co-pending patent. Nine binary bits of target distance result in a maximum of 511 cells which, with cells of 2½ inches, gives a maximum target distance of slightly over 106 ft. which is suitable for speeds up to about 1600 ft./min. The circuit could easily be altered to transmit more bits.

If the target distance exceeds the maximum value, signal SS3 is high during the transmission of bit 10 or afterwards, and gate 163 detects this since signal D10X is high during and after the transmission of bit 10. A low in the output of gate 163 causes the flip-flop consisting of gates 164 and 165 to alter its state so that at the end of the next read-out, when $n$R01 goes high, flip-flop 167 is clocked to its alternate state wherein its output $n$Q becomes low to block the SS3 signal, and its output Q becomes high to transmit a 1 for bits 1 to 9 and a 0 for bit 10, as obtained from signal $n$D10X.

A further CLOCKED FLIP-FLOP 171 conveniently cleans up the signal by holding its state between successive low to high transmissions of clock signal CD. Otherwise, the gaps caused by the clocking of the triple serial adder 141 would appear on the final output line $n$TGD.

The signal on $n$TGD is thus a serial read-out of the computed target distance. Methods of utilizing such a signal will be covered in a co-pending patent.

The signal $n$BA is convenient for applying to the $n$CR input (CARRY RESET) of triple serial adder 141. This is required to separate the successive binary numbers entering the adder, so as not to be treated as one continuous binary number.

Figure 16B:
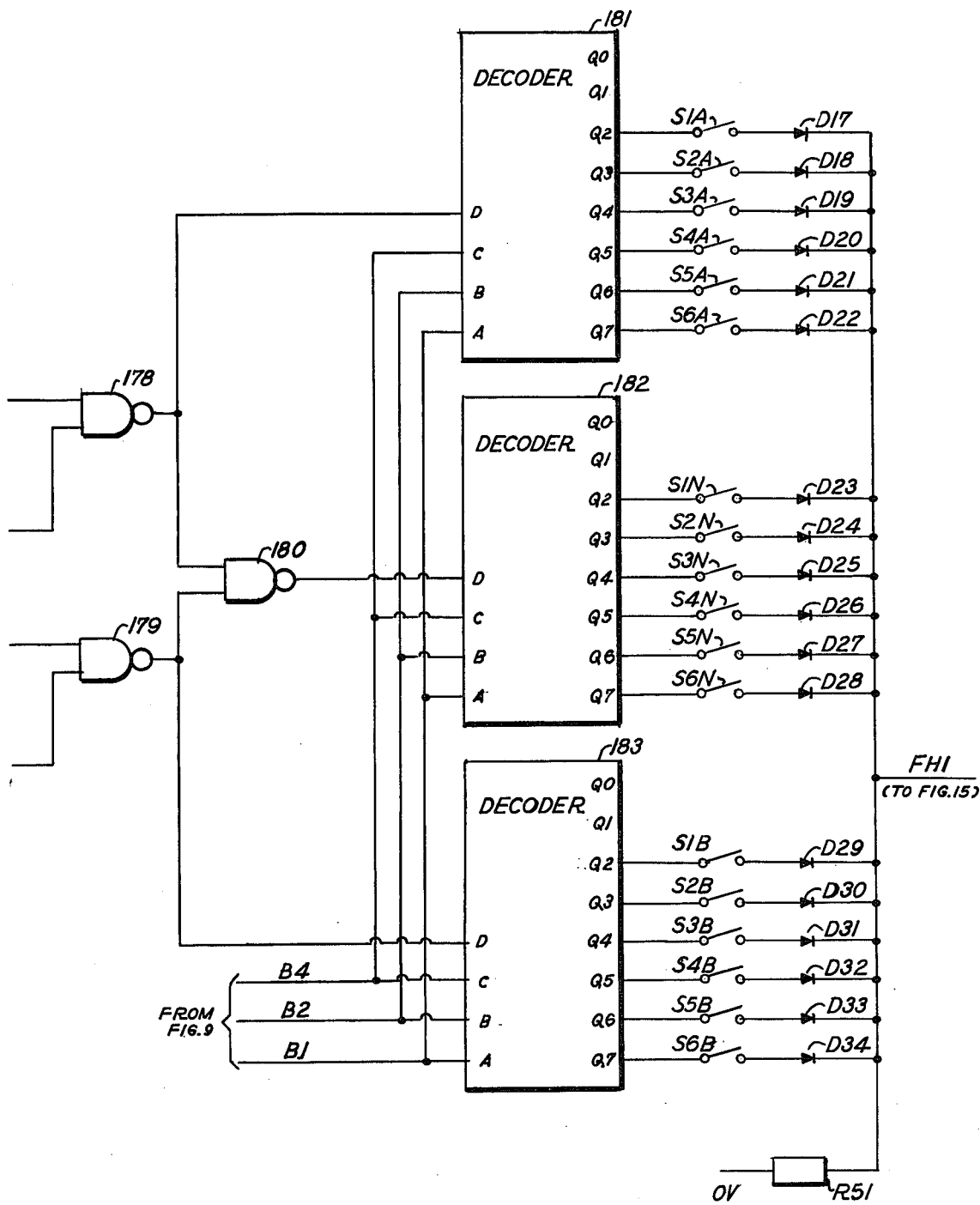
FIGS. 16A and 16B show a circuit for a floor-height memory.
Figure 16A:
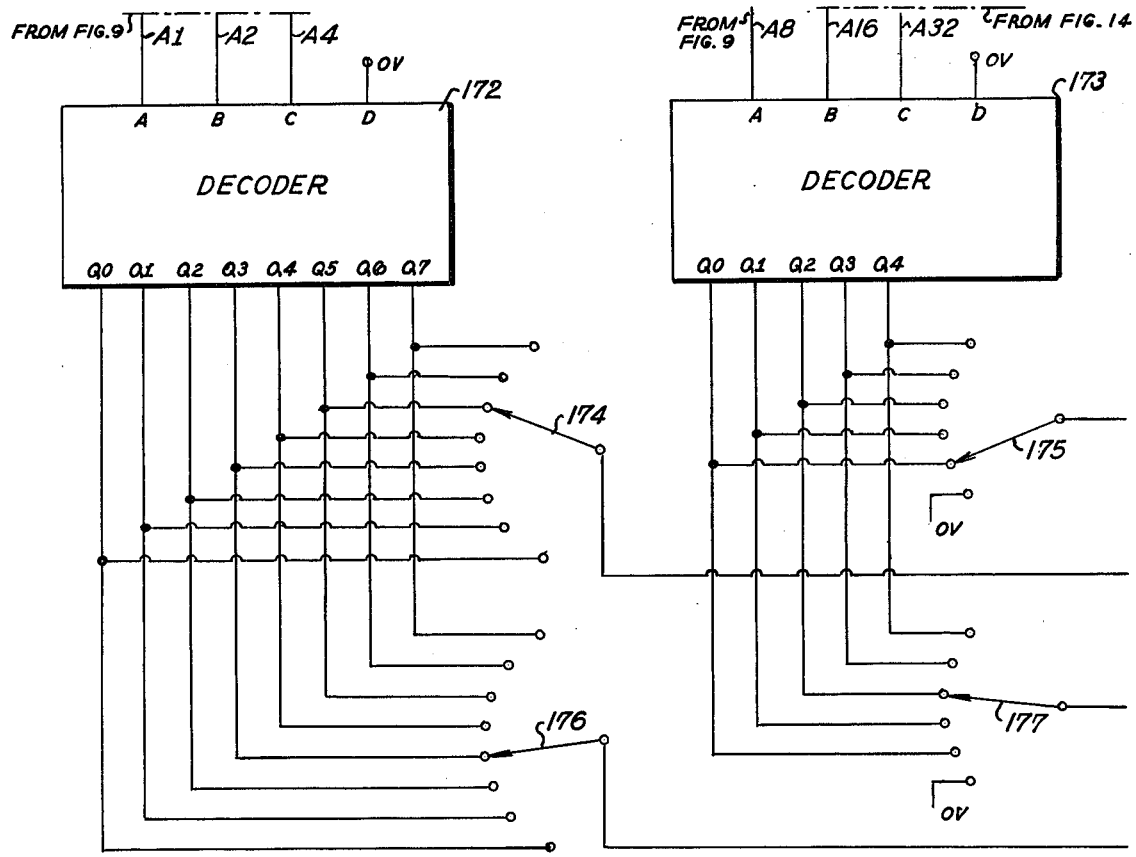

FIG. 16 shows one possible circuit for handling the floor height memory. On FIG. 16 there are 3 groups of six toggle switches which can be used to program 3 different floor heights. Switches S1N - S6N are for a normal floor height. The remaining two groups of switches are for 2 different floor heights.

In most buildings, the majority of the floors heights are identical, and one or two are different. The circuits on FIG. 16 could be extended, if required, to handle further special floor heights.

Two rotary switches 174 and 175 can be used to select one of the two special floors, where the floor height is different from the normal ones. Another two rotary switches 176 and 177 can be used to select another special floor.

Decoders 172 and 173 convert to the address digits A1 - A32 into octal form so that the rotary switches can pick out the appropriate address. Thus the output of gate 178 becomes low when the address register is at a number corresponding to one of the odd floors. Similarly, the output of gate 179 is low when the address register is at a number corresponding to the other odd floor. An additional position on switches 175 and 177 permits a setting which holds the output of gate 178 or 179 high so as to not use the corresponding floor height switches.

When neither gate 178 or 179 has a low output, both inputs of gate 180 are high and thus its iutput is low. This causes decoder 182 to apply positive pulses to switches S1N - S6N in sequence because of inputs B1, B2 and B4. A switch closed causes the associated diode to pull up the output line FH1 when the corresponding decoder output is high. An open switch prevents such pull up of output FH1. Thus any desired 6 bit number can be programmed by these switches to suit the normal floor height.

If the output of gate 178 is low, it makes decoder 181 active and also causes the output of gate 180 to become high to inhibit decoder 182. Similarly, if the output of gate 179 is low, decoder 183 becomes active and decoder 182 is again inhibited.

Resistor R51 pulls the FH1 signal down when it is not being pulled by a diode. Although the circuit shown in FIG. 16 actually repeats the FH1 signal in the second half of each BASIC SEQUENCE, gate 143 in FIG. 15 has an input $n$B8 which holds $n$FH high in spite of this for the second half of the BASIC SEQUENCE.

Figure 17:
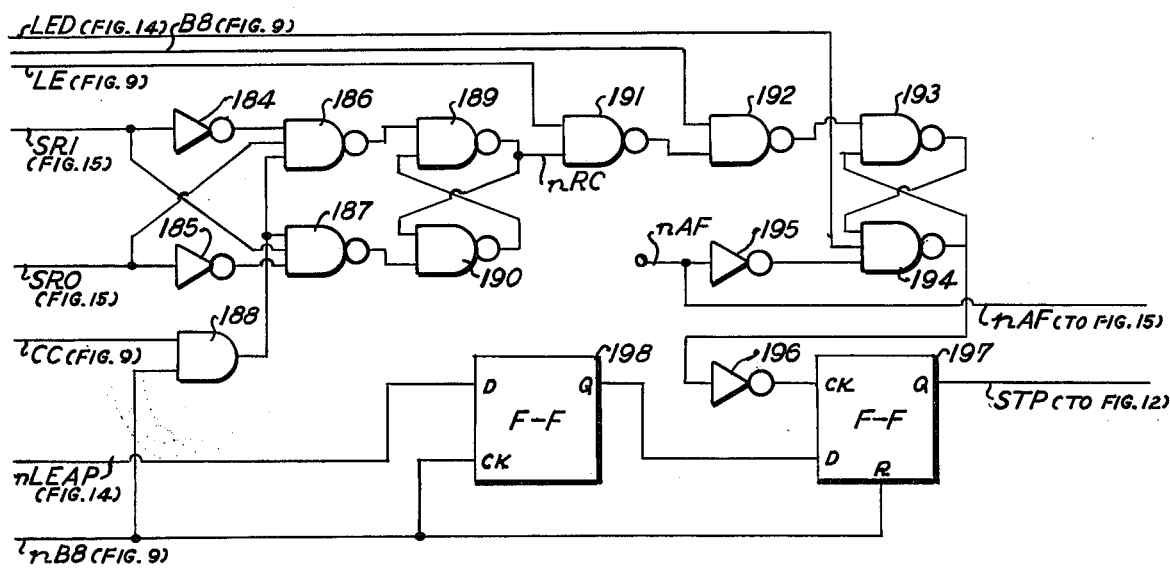
FIG. 17 shows a circuit for setting the target floor to agree with the position of the car in the hoistway.

The circuit of FIG. 17 can be used to force the target floor to agree with the car's position after a power failure, or when the car is stopped and the target floor is falsely jumped to the wrong condition by electromagnetic interference. To activate the feature, input $n$AF must be made low by other circuits at the appropriate time.

When input $n$AF is low, the SS3 signal is prevented from entering the shift register 151 in FIG. 15, and instead the SS1 signal is gated into the shift register. Also, the inverting input $n$I of adder 141A on FIG. 15 is gated from $n$BH rather than TFB. This causes the SS1 signal to always represent a positive number for the loop distance.

The result is that for any loop excitation, the loop distance appears on the input signal SRI of the shift register, and appears on the output SRO during the following BASIC SEQUENCE.

A running comparison of the SRI and SRO signals is made by a flip-flop consisting of gates 186 and 187. At each step of the first half of the BASIC SEQUENCE, when signal $n$B8 is high, the condition of signals SRI and SRO may cause the flip-flop to change its state. However, if signals SRI and SRO are both in the same state, gates 186 and 187 each have at least one input low, and thus their outputs remain high to prevent any change in state of the flip-flop.

If signals SRI and SRO are in different states, either gate 186 or gate 187 has all three inputs high during clock pulse CC, and this causes a low output from gate 186 or 187 to set the flip-flop to a particular state if it is not already in that state.

At the end of the first half of a BASIC SEQUENCE, all six bits of the loop distance have been sequentially applied to signal SRI, and compared with signal SRO which is the previous loop distance, assuming that two adjacent pulse cards caused loop excitations. Since the most significant digit occurs last, the condition of signal $n$RC at the end of this comparison indicates whether the present loop distance is greater, or less than the previous. If the present loop distance is greater, signal $n$RC is low; otherwise it is high.

When signal $n$AF is low, the output of gate 195 is high, and when signal LED is also high, there is an opportunity for a flip-flop consisting of gates 193 and 194 to be set to a condition which will make the output of inverter 196 high. This happens when signal B8 is high, and only when the running comparison signal $n$RC is lower (to indicate that the previous loop distance was greater) or when signal LE is low to indicate that signal LED will go low at the next BASIC SEQUENCE. In either case, this situation is an indication that the target floor should be the previous floor.

If the target floor is the previous floor, the Q output of CLOCKED FLIP-FLOP 198 will be low, and thus when the output of inverter 196 goes high, CLOCKED FLIP-FLOP 197 will remain in its reset state with output STP low. However, if the previous floor is not the target floor, the output Q of flip-flop 198 is high and then the low to high transition of the output of inverter 196 causes the output STP of flip-flop 197 to go high and remain so until the end of the BASIC SEQUENCE, when signal $n$B8 goes high. This positive pulse on signal STP is applied to gates 88 and 89 on FIG. 12 and, depending on whether the target floor is above or below (as indicated by signal $n$TFB), the output of either gate 89 or 88 goes low to cause the target floor to advance one stop down or up, as described before.

If this one step does not bring the target floor into agreement with the car's position, a similar step will occur at the similar point in the next address sequence, and this process continues until the target floor agrees with the floor where the car is situated, or the closest floor to the car.

The target distance which is calculated by the circuits described earlier can be utilized to control the instantaneous speed of the car. The result is to provide all of the necessary information to permit the solid state selector system to replace conventional mechanical selectors, except for one important consideration. It is desirable to permit the elevator car to move toward floor level at low speed with the doors open, in order to maintain the car level with a floor in spite of stretching or shortening of the lift cables as passengers enter or leave the car. It is also customary to permit the doors to start opening while the car is still moving, during the last foot or so of travel toward a floor.

A conventional mechanical selector has one or more contacts actuated by car position which operates relays to permit the aforementioned movements with the doors open, but which also restrict such motion to specific distances above and below each entrance, for safety. Similar relays can be operated from the solid state selector system disclosed in this patent, by winding further loops onto the stick.

FIG. 18 shows a circuit for driving the coil LZ of a landing zone relay from a loop L7. Current flowing from supply line P10 through resistors R52, R53 and zener diode Z9 causes line P5Z to assume a positive voltage, possibly 5 volts, with respect to line OV. Line PRZ has a slightly higher voltage than line P5Z.

Loop L7 is situated near the center of the loop stick and has connecting wires 205 and 206 close together so that energy from the de-energization of coils on a pulse card can only induce a voltage difference into lines 205 and 206 when the car is situated close to any floor.

If no voltage is induced in loop L7, the output of comparator 203 is continuously high. If a pulse card is inducing sufficient voltage into loop L7, the output of comparator 203 has a brief negative pulse occurring once in each ADDRESS SEQUENCE. A MONOSTABLE MULTIVIBRATOR 204 expands these pulses to approximately one half of the duration of the ADDRESS SEQUENCE. The output of MM204 is applied through resistor R54 to the base of transistor Q14.

Thus if there are pulses detected in loop L7, transistor Q14 turns on and off with approximately equal on and off times. Resistor R55 acts as a pull-up resistor to apply a square-wave A.C. signal to the coil of relay LZ via capacitor C10. The capacitor prevents relay LZ from being supplied with direct current.

If there are no pulses detected in loop L7, or if there is any failure in components 203, 204 or Q14, relay LZ is de-energized.

Several circuits similar to FIG. 18 can be used for landing zones above and below the floor as required to meet the normal requirements of safety. The contacts of other relays similar to LZ can be used in a similar manner to the corresponding contacts which are available on mechanical selectors.

Thus there is provided, in accordance with the present invention, a novel and improved apparatus for determining the location of an elevator car or similar vehicle. The apparatus includes a plurality of signal transmitters, spaced apart in the direction of vehicle travel, which are caused to transmit signals, one transmitter at a time, with the respective transmissions occurring in a constantly repeating sequence. A plurality of signal receivers, also spaced apart in the direction of vehicle travel and capable of receiving signals only from an immediately adjacent transmitter, detect selected transmissions and thereby establish a pair of "known" positions for determining the location of the vehicle along its path of travel: namely, the position of the transmitter whose transmission was received and the position of the receiver which received this transmission.

It will be understood that the above-described embodiments are merely exemplary and that persons skilled in the art may make many variations and modifications thereto without departing from the spirit and scope of the present invention. All such variations and modifications are intended to be within the scope of the invention as defined in the appended claims.

I claim:

1. Apparatus for determining the location of a vehicle arranged to move along a predetermined path of travel, said apparatus comprising:
   (a) a plurality of first means for transmitting signals;
   (b) a plurality of second means for receiving signals from an adjacent one of said first means;
   (c) third means, coupled to said first means, for causing said first means to transmit signals, one first means at a time, the transmissions occurring in a constantly repeating sequence; and
   (d) fourth means, coupled to said second means, for determining the location of said vehicle along said path of travel;
   one of said first and second means being arranged at intervals along said path of travel and the other of said first and second means being arranged on said vehicle along a line extending in the direction of vehicle travel.

2. The apparatus defined in claim 1, wherein said first means are stationary with respect to the ground and are arranged at intervals along said path of travel and said second means are stationary with respect to said vehicle and are arranged on said vehicle along a line extending in the direction of vehicle travel.

3. The apparatus defined in claim 2, wherein said third means causes said first means to transmit signals, one first means at a time, the sequence of transmissions occurring at a repetition rate which assures that the movement of the vehicle between two successive signal receipts by said second means is within an allowable tolerance.

4. The apparatus defined in claim 2, wherein the distance between successive ones of said first means is equal to or less than the length of the line of said second means.

5. The apparatus defined in claim 1, wherein a plurality of stations are located at intervals along said path of travel, said vehicle being operable to stop at said stations, and wherein said fourth means includes fifth means for determining the position of said vehicle with respect to at least one of said stations.

6. The apparatus defined in claim 5, wherein said fifth means is operative to calculate the distance between the present location of said vehicle and a desired station.

7. The apparatus defined in claim 1, wherein said vehicle is an elevator car arranged to move along a hoistway and to stop at selected ones of a plurality of floors.

8. The apparatus defined in claim 7, wherein said fourth means includes fifth means for calculating the target distance between the present location of the elevator car and a target floor to which the elevator car is nearest, if stationary, or which is the nearest floor at which the car is capable of stopping, if running.

9. The apparatus defined in claim 7, wherein one of said first means is associated with and located adjacent each floor in said hoistway at which said elevator car is required to stop and said second means are arranged on said elevator car.

10. The apparatus defined in claim 9, wherein said first means are all in the same location in plan view and are situated at the same vertical distance from their associated floors.

11. The apparatus defined in claim 10, wherein each of said first means is located above its associated floor at a distance approximately equal to half the vertical height of said elevator car.

12. The apparatus defined in claim 7, wherein each of said first means comprises at least one electromagnetic coil arranged in said hoistway in stationary relationship with respect to said floors.

13. The apparatus defined in claim 12, wherein each of said first means comprises two electromagnetic coils arranged on a common horizontal axis and separated by an airgap.

14. The apparatus defined in claim 12, further comprising a loop stick mounted vertically on said elevator car,
   and wherein each of said second means comprises at least one loop of wire arranged along said loop stick in field-coupling relationship with said electromagnetic coils as said elevator car travels in said hoistway.

15. The apparatus defined in claim 14, wherein the vertical extent of said loop stick is greater than the height of the cab of said elevator car.

16. The apparatus defined in claim 14, wherein said loop stick extends vertically a greater distance than the normal distance between adjacent floors.

17. The apparatus defined in claim 14, wherein each of said second means comprises a single turn loop of wire extending essentially from the top to the bottom of said loop stick.

18. The apparatus defined in claim 14, wherein each of said at least one loop of wire has at least one crossover where the vertical conductors cross over in a substantially horizontal line so as to interchange positions.

19. The apparatus defined in claim 14, wherein one of said first means is associated with and located adjacent each floor in said hoistway at which said elevator car is required to stop and wherein said electromagnetic coil of each of said first means is located above its associated floor at such a distance from such floor that, when said elevator car is level with such floor, said electromagnetic coil is approximately centered on the vertical length of said loop stick.

20. The apparatus defined in claim 14, wherein said third means includes means for causing the collapse of magnetic fields generated by said electromagnetic coils of said first means, thereby to induce voltages in said loops of wire of said second means when an electromagnetic coil is adjacent said loops.

21. The apparatus defined in claim 20, wherein said collapse of a magnetic field produces a pulse pattern at the outputs of said loops of wire, and wherein said loops of wire are arranged such that said pulse pattern forms a Gray code of the vertical position of the elevator car with respect to the adjacent transmitting electromagnetic coil.

22. The apparatus defined in claim 20, wherein said collapse of a magnetic field produces a pulse pattern at the outputs of said loops of wire and wherein said fourth means includes sixth means on said elevator car for converting said pulse pattern into serially arranged information, seventh means on said elevator car for transmitting said serial information on a single channel and eighth means, arranged in a stationary position with respect to said hoistway, for receiving said serial information from said channel.

23. The apparatus defined in claim 18, wherein said fourth means further includes ninth means for interpreting the signals produced at the outputs of said loops of wire for producing a pulse pattern even when the signal at the output of one loop of wire is indeterminate.

* * * * *